United States Patent
Okada et al.

(10) Patent No.: US 11,533,832 B2
(45) Date of Patent: *Dec. 20, 2022

(54) ELECTROMAGNETIC WAVE ABSORBING PARTICLE DISPERSOID AND ELECTROMAGNETIC WAVE ABSORBING LAMINATED TRANSPARENT BASE MATERIAL

(71) Applicant: SUMITOMO METAL MINING CO., LTD., Tokyo (JP)

(72) Inventors: Mika Okada, Kagoshima (JP); Katsushi Ono, Chiba (JP); Satoshi Yoshio, Tokyo (JP); Kenji Adachi, Chiba (JP); Keisuke Machida, Chiba (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/636,371

(22) PCT Filed: Jul. 25, 2018

(86) PCT No.: PCT/JP2018/027872
§ 371 (c)(1),
(2) Date: Feb. 4, 2020

(87) PCT Pub. No.: WO2019/031242
PCT Pub. Date: Feb. 14, 2019

(65) Prior Publication Data
US 2020/0170150 A1 May 28, 2020

(30) Foreign Application Priority Data
Aug. 9, 2017 (JP) .............................. JP2017-154812

(51) Int. Cl.
*H05K 9/00* (2006.01)
*B32B 7/023* (2019.01)
(Continued)

(52) U.S. Cl.
CPC ........... *H05K 9/0083* (2013.01); *B32B 7/023* (2019.01); *B32B 27/20* (2013.01); *C01G 41/00* (2013.01);
(Continued)

(58) Field of Classification Search
CPC ...... H05K 9/0083; B32B 7/023; B32B 27/20; C01G 41/00; C01G 41/006; C01G 41/02; C08L 69/00
See application file for complete search history.

(56) References Cited

U.S. PATENT DOCUMENTS 6,416,890 B1   7/2002 Terneu et al.
8,083,847 B2 * 12/2011 Takeda .................. C01G 41/00
(Continued)

FOREIGN PATENT DOCUMENTS

CN    1745149     3/2006
CN    104231306   12/2014
(Continued)

OTHER PUBLICATIONS

International Search Report dated Oct. 2, 2018 with respect to PCT/JP2018/027872.
(Continued)

*Primary Examiner* — James A Fiorito
(74) *Attorney, Agent, or Firm* — IPUSA, PLLC

(57) ABSTRACT

An electromagnetic wave absorbing particle dispersoid is provided that includes at least electromagnetic wave absorbing particles and a thermoplastic resin, wherein the electromagnetic wave absorbing particles contain hexagonal tungsten bronze having oxygen deficiency, wherein the tungsten
(Continued)

bronze is expressed by a general formula: $M_xWO_{3-y}$ (where one or more elements M include at least one or more species selected from among K, Rb, and Cs, $0.15 \leq x \leq 0.33$, and $0 < y \leq 0.46$), and wherein oxygen vacancy concentration $N_V$ in the electromagnetic wave absorbing particles is greater than or equal to $4.3 \times 10^{14}$ cm$^{-3}$ and less than or equal to $8.0 \times 10^{21}$ cm$^{-3}$.

17 Claims, 2 Drawing Sheets

(51) Int. Cl.
- B32B 27/20 (2006.01)
- C01G 41/00 (2006.01)
- C08K 3/22 (2006.01)
- C01G 41/02 (2006.01)
- C08L 69/00 (2006.01)

(52) U.S. Cl.
CPC ........... *C01G 41/006* (2013.01); *C01G 41/02* (2013.01); *C08K 3/22* (2013.01); *C08L 69/00* (2013.01); *B32B 2264/102* (2013.01); *B32B 2307/212* (2013.01); *B32B 2307/412* (2013.01); *C01P 2002/76* (2013.01); *C01P 2002/78* (2013.01); *C01P 2004/10* (2013.01); *C01P 2004/64* (2013.01); *C01P 2006/40* (2013.01); *C01P 2006/42* (2013.01); *C01P 2006/90* (2013.01); *C08K 2003/2258* (2013.01); *C08K 2201/005* (2013.01); *C08K 2201/011* (2013.01); *C08L 2666/72* (2013.01)

(56) References Cited

U.S. PATENT DOCUMENTS

| | | | |
|---|---|---|---|
| 8,980,135 | B2 | 3/2015 | Takeda et al. |
| 10,308,801 | B2 * | 6/2019 | Machida ................. C08L 33/00 |
| 11,105,959 | B2 | 8/2021 | Takeda et al. |
| 2003/0064179 | A1 | 4/2003 | Kijima et al. |
| 2006/0178254 | A1 | 8/2006 | Takeda et al. |
| 2014/0370263 | A1 | 12/2014 | Lu et al. |
| 2019/0161361 | A1 | 5/2019 | Tsunematsu et al. |
| 2019/0225503 | A1 | 7/2019 | Okada et al. |

FOREIGN PATENT DOCUMENTS

| | | |
|---|---|---|
| EP | 3492544 | 6/2019 |
| JP | H08-012378 | 1/1996 |
| JP | H08-059300 | 3/1996 |
| JP | H08-283044 | 10/1996 |
| JP | H09-107815 | 4/1997 |
| JP | 2000-119045 | 4/2000 |
| JP | 2003-029314 | 1/2003 |
| JP | 2004-500240 | 1/2004 |
| JP | 2015-003853 | 1/2015 |
| WO | 2005/037932 | 4/2005 |
| WO | 2017/094909 | 6/2017 |
| WO | 2018/020819 | 2/2018 |

OTHER PUBLICATIONS

International Search Report dated Oct. 2, 2018 with respect to PCT/JP2018/027899.

International Search Report dated Oct. 2, 2018 with respect to PCT/JP2018/027879.

K. Machida et al., 2016, P.03-504, 16p-B12-10, "Coexistence of plasmon and polaron in hexagonal tungsten bronze nanoparticles", Presentation by the 77th autumn scientific lecture meeting of the Society of Applied Physics, Toki Miesse 2016 (Niigata City, Niigata Prefecture).

K. Machida et al., Mar. 17, 2017, P.2747, 20aC43-10, "Oxygen defects and optical properties of tungsten bronze fine particles", Summary of the 72nd Annual Meeting of the Japan Society of Physics (2017), Web version ISSN 2189-0803 DVD version ISSN 2189-079X.

L. C. Ting et al., "Metal-Nonmetal Transition in Rubidium Tungsten Bronze RbxWOy", Journal of Superconductivity, 2002, vol. 15, No. 6, pp. 675-678.

A. D. Walkingshaw et al., "A Density-functional study of charge doping in WO3", Phys. Rev. B 70 (2004) 165110-1-7.

J. Ol et al., "Hexagonal tungsten trioxide obtained from peroxo-polytungstate and reversible lithium electro-intercalation into its framework", Journal of Solid State Chem. 96 (1992) pp. 13-19.

Office Action dated Jan. 5, 2022 with respect to the related U.S. Appl. No. 16/636,742.

Office Action dated Nov. 22, 2022 issued with respect to the related U.S. Appl. No. 17/451,921.

* cited by examiner

ELECTROMAGNETIC WAVE ABSORBING PARTICLE DISPERSOID AND ELECTROMAGNETIC WAVE ABSORBING LAMINATED TRANSPARENT BASE MATERIAL

TECHNICAL FIELD

The present invention relates to electromagnetic wave absorbing particle dispersoids and electromagnetic wave absorbing laminated transparent base materials.

BACKGROUND ART

According to the fifth edition of the Physical and Chemical Dictionary, light is defined as "Electromagnetic waves with wavelengths in the range of about 1 nm to 1 mm are called light". This range of wavelengths includes the visible light region and the infrared region.

As a light shielding member used for windows and the like, in Patent Document 1, a light shielding film is proposed that contains a black-based pigment including an inorganic pigment such as carbon black and titanium black that absorbs rays in the visible light region to the near-infrared region; and an organic pigment such as aniline black that absorbs rays strongly only in the visible light region.

Also, in Patent Document 2, a half-mirror-type light shielding member is proposed on which metal such as aluminum is deposited.

In Patent Document 3, a heat shielding glass is proposed that has, on a transparent glass substrate, a composite tungsten oxide film containing at least one species of metal ions selected from among a group consisting of Group IIIa, Group IVa, Group Vb, Group VIb, and Group VIIb of the periodic table, which is provided as the first layer counted from the substrate side; a transparent dielectric film as the second layer provided on the first layer; and a composite tungsten oxide film containing at least one species of metal ions selected from among a group consisting of Group IIIa, Group IVa, Group Vb, Group VIb, and Group VIIb of the periodic table, as the third layer provided on the second layer. This heat shielding glass has a refractive index of the transparent dielectric film as the second layer that is smaller than the refractive indices of the composite tungsten oxide films as the first layer and the third layer, and thereby, can be suitably used as a part that is required to have high visible light transmittance and good heat-ray shielding performance.

In Patent Document 4, a heat-ray shielding glass is proposed in which, on a transparent glass substrate, in substantially the same way as in Patent Document 3, a first dielectric film is provided as the first layer counted from the substrate side; a tungsten oxide film is provided on the first layer as the second layer; and a second dielectric film is provided as the third layer on the second layer.

In Patent Document 5, a heat-ray shielding glass is proposed in which, on a transparent substrate, in substantially the same way as in Patent Document 3, a composite tungsten oxide film containing similar metallic elements is provided as the first layer counted from the substrate side; and a transparent dielectric film is provided as the second layer on the first layer.

In Patent Document 6, a solar controlling glass sheet is proposed that is formed to be covered by a metal oxide film that is formed by CVD or spraying, applied with pyrolysis at around 250° C. to have a solar shielding characteristic, where the metal oxide film is selected from among one or more species of tungsten trioxide ($WO_3$), molybdenum trioxide ($MoO_3$), niobium pentoxide ($Nb_2O_5$), tantalum pentoxide ($Ta_2O_5$), vanadium pentoxide ($V_2O_5$), and vanadium dioxide ($VO_2$) that contain an additive material such as hydrogen, lithium, sodium, or potassium.

Meanwhile, the applicant has disclosed in Patent Document 7 a fine particle dispersoid of an infrared-shielding material in which fine particles of the infrared-shielding material are dispersed in a medium, wherein the fine particles of the infrared-shielding material contain fine particles of tungsten oxide and/or fine particles of composite tungsten oxide; and the diameter of dispersed particles of the fine particles of the infrared-shielding material is greater than or equal to 1 nm and less than or equal to 800 nm.

RELATED-ART DOCUMENTS

Patent Documents

[Patent Document 1] Japanese Patent Application Publication No. 2003-029314
[Patent Document 2] Japanese Patent Application Publication No. H9-107815
[Patent Document 3] Japanese Patent Application Publication No. H8-59300
[Patent Document 4] Japanese Patent Application Publication No. H8-12378
[Patent Document 5] Japanese Patent Application Publication No. H8-283044
[Patent Document 6] Japanese Patent Application Publication No. 2000-119045
[Patent Document 7] International Publication No. 2005/037932

Non-Patent Documents

[Non-Patent Document 1] A. D. Walkingshaw, N. A. Spaldin, and E. Artacho, Density-functional study of charge doping in $WO_3$, Phys. Rev. B 70 (2004) 165110-1-7
[Non-Patent Document 2] J. Oi, A. Kishimoto, T. Kudo, and M. Hiratani, Hexagonal tungsten trioxide obtained from peroxo-polytungstate and reversible lithium electron-intercalation into its framework, J. Solid State Chem. 96 (1992) 13

SUMMARY OF THE INVENTION

Problem to be Solved by the Invention

Meanwhile, in recent years, while reducing the solar transmittance of, for example, glass for automobiles, for electromagnetic waves in the near-infrared region including a wavelength of 850 nm used for various infrared sensors, demand has been increasing for higher transmittance.

Patent Document 7 described above discloses fine particles of tungsten oxide and/or fine particles of composite tungsten oxide that are capable of absorbing electromagnetic waves in the infrared region. However, there is no disclosure of a guideline for selecting composite tungsten oxide having excellent transmittance of near-infrared rays having wavelengths around 850 nm to be used for various infrared sensors while reducing the solar transmittance.

In one aspect of the present invention, it is an object to provide an electromagnetic wave absorbing particle dispersoid having an excellent transmission characteristic for near-infrared rays having a wavelength of 850 nm while controlling the solar transmittance.

Means to Solve the Problem

In one aspect of the present invention, an electromagnetic wave absorbing particle dispersoid is provided that includes at least electromagnetic wave absorbing particles and a thermoplastic resin, wherein the electromagnetic wave absorbing particles contain hexagonal tungsten bronze having oxygen deficiency, wherein the tungsten bronze is expressed by a general formula: $M_xWO_{3-y}$ (where one or more elements M include at least one or more species selected from among K, Rb, and Cs, $0.15 \leq x \leq 0.33$, and $0 < y \leq 0.46$), and wherein oxygen vacancy concentration $N_V$ in the electromagnetic wave absorbing particles is greater than or equal to $4.3 \times 10^{14}$ cm$^{-3}$ and less than or equal to $8.0 \times 10^{21}$ cm$^{-3}$.

Advantage of the Invention

In one aspect of the present invention, it is possible to provide an electromagnetic wave absorbing particle dispersoid having an excellent transmission characteristic for near-infrared rays having a wavelength of 850 nm while controlling the solar transmittance.

MODE FOR CARRYING OUT THE INVENTION

Electromagnetic Wave Absorbing Particles

Figure 1:
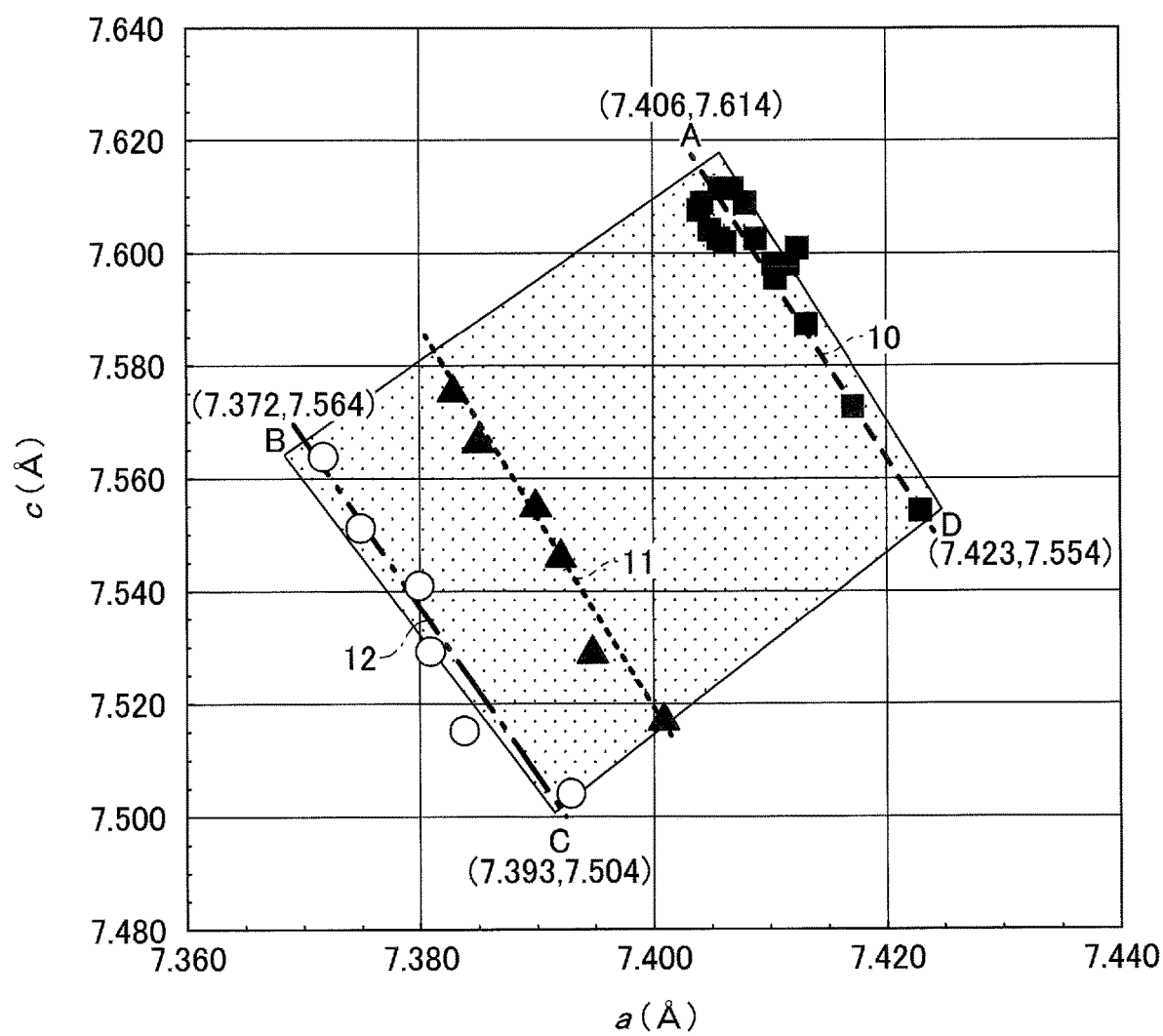
FIG. 1 is an explanatory diagram of correlation between the composition of tungsten bronze and the lattice constants.

In the present embodiment, an example of a configuration of electromagnetic wave absorbing particles will be described.

Electromagnetic wave absorbing particles according to the present embodiment can contain hexagonal tungsten bronze having oxygen deficiency. In addition, such tungsten bronze is expressed by a general formula: $M_xWO_{3-y}$ (where one or more elements M include at least one or more species selected from among K, Rb, and Cs, $0.15 \leq x \leq 0.33$, and $0 < y \leq 0.46$) and can have an oxygen vacancy concentration $N_V$ greater than or equal to $4.3 \times 10^{14}$ cm$^{-3}$ and less than or equal to $8.0 \times 10^{21}$ cm$^{-3}$.

Conventionally, hexagonal $M_xWO_3$ has been proposed as tungsten bronze. Hexagonal tungsten bronze has a structure in which ions of the element(s) M, such as an alkali metal, are inserted in gaps of large hexagonal tunnels formed in a basic skeleton in octahedrons of $WO_6$ (W: tungsten, O: oxygen) as basic units are connected at the corners.

The maximum number of atoms of the element(s) M that can enter the hexagonal tunnels is 0.33 for W, and this value has been targeted practically.

On the other hand, the oxygen deficiency of tungsten bronze has not been understood in detail. Therefore, for tungsten bronze, the chemical formula of $M_xWO_3$ that expresses the full stoichiometric ratio of oxygen is well established regardless of the production method. In other words, in a tungsten bronze structure, it has been generally understood that the oxygen deficiency is essentially zero or in a small amount even if it is present.

However, in the primitive form of tungsten oxide ($WO_3$) that does not contain the element(s) M, it has been reported that reduction treatment easily generates $WO_{3-x}$ in which the stoichiometric ratio of oxygen is decreased, and depending on the degree of reduction, different crystal structures, conductivities, and optical properties are observed. In $WO_{3-x}$ referred to as the so-called "Magneli phase", deviation from the stoichiometric ratio is compensated by, not oxygen vacancies, but W-rich surface defects called a crystallographic shear plane.

One of the reasons why tungsten bronze has not been examined quantitatively with respect to the relationship between the presence of oxygen deficiency and its structure would be, unlike tungsten oxide, the fact that the presence of such surface defects has not been noticeably observed with a TEM (transmission electron microscope) or the like.

The inventors of the present invention focused on and investigated oxygen deficiency as a method of making electromagnetic wave absorbing particles having excellent near-infrared transmission characteristics with respect to a wavelength of 850 nm while controlling the solar transmittance.

The inventors of the present invention produced by way of trial a series of hexagonal $M_xWO_3$ in a strongly reducible atmosphere; analyzed the compositions; and studied the crystal structures and optical properties. As a result, the inventors of the present invention found that a significantly great amount of oxygen deficiency could be introduced into the tungsten bronze. Therefore, the tungsten bronze is denoted with the general formula: $M_xWO_{3-y}$.

According to the investigations conducted by the inventors of the present invention, in tungsten bronze, it is possible to reduce the solar transmittance by introducing the element(s) M and oxygen deficiency.

The inventors of the present invention found that by introducing and increasing the element(s) M, and introducing and increasing the oxygen deficiency, the amount of free electrons and localized electrons increases. More specifically, by introducing and increasing the element(s) M, only the supply of free electrons increases. On the other hand, the inventors of the present invention found that by introducing and increasing the oxygen deficiency, free electrons and localized electrons are supplied in a ratio of approximately 2:8.

Therefore, by introducing and increasing the element(s) M, and introducing and increasing the oxygen deficiency, both the plasmon absorption and the polaron absorption become greater, and thereby, and the electromagnetic wave absorption effect becomes greater. In other words, it is possible to control the solar transmittance.

According to the investigations conducted by the inventors of the present invention, the plasmon absorption and the polaron absorption of tungsten bronze appear in the near-infrared region, which is greater than or equal to 0.5 eV and less than or equal to 1.8 eV (greater than or equal to 690 nm and less than or equal to 2480 nm).

The plasmon absorption appears at a slightly lower energy level than the polaron absorption, and the polaron transition wavelength of tungsten bronze is present in the vicinity of red in the visible light region to the near-infrared region, or a region greater than or equal to 1.0 eV and less than or equal to 1.8 eV (greater than or equal to 690 nm and less than or equal to 1240 nm). Therefore, in order to increase the near-infrared transmittance at the wavelength of 850 nm while controlling the solar transmittance, it is favorable to control the polaron absorption.

Further, according to the investigations conducted by the inventors of the present invention, making the amount of oxygen deficiency smaller enables to control the polaron absorption; therefore, it is favorable to control the oxygen deficiency not to become excessively great.

Thereupon, electromagnetic wave absorbing particles according to the present embodiment can contain hexagonal tungsten bronze having oxygen deficiency. Note that electromagnetic wave absorbing particles according to the present embodiment can also be constituted with such tungsten bronze. Moreover, such tungsten bronze is expressed by a general formula: $M_xWO_{3-y}$, and the oxygen vacancy concentration (oxygen vacancy density) $N_V$ can be set greater than or equal to $4.3 \times 10^{14}$ cm$^{-3}$.

A lower oxygen vacancy concentration can make the near-infrared transmittance at the wavelength of 850 nm higher. However, $N_V$ cannot be lower than the thermal equilibrium oxygen vacancy concentration that inevitably exists at that temperature. Here, the thermal equilibrium vacancy concentration in tungsten bronze is estimated to be approximately $4.3 \times 10^{14}$ cm$^{-3}$. Free electrons from alkaline ions cause the plasmon absorption even in the case of $N_V$ at the lower limit of $4.3 \times 10^{14}$ cm$^{-3}$; therefore, it is possible to sufficiently reduce the solar transmittance. On the other hand, if oxygen deficiency is introduced excessively, the near-infrared transmittance at the wavelength of 850 nm may be decreased. Therefore, it is favorable that the oxygen vacancy concentration is less than or equal to $8.0 \times 10^{21}$ cm$^{-3}$. It is more favorable that the oxygen vacancy concentration is greater than or equal to $4.0 \times 10^{21}$ cm$^{-3}$ and less than or equal to $8.0 \times 10^{21}$ cm$^{-3}$.

The oxygen vacancy concentration can be calculated from the composition of tungsten bronze contained in electromagnetic wave absorbing particles according to the present embodiment and the lattice constants.

As described above, oxygen deficiency in the composition of the entirety of tungsten bronze can be designated by y in the general formula described above. However, the crystal lattice of tungsten bronze is distorted by the Jahn-Teller effect, the volume of a unit cell also changes with x and y. Therefore, in order to obtain an excellent transmission characteristic of near-infrared rays having a wavelength of 850 nm while controlling the solar transmittance, it is necessary that not only the value of y, but also the oxygen vacancy concentration fall within the above ranges, respectively.

Note that in the case of further increasing the near-infrared transmittance at the wavelength of 850 nm, a method may be adopted that also controls the plasmon absorption. In this case, in addition to the oxygen deficiency and the oxygen vacancy concentration described above, it is favorable that the amount of the element(s) M to be added is also adjusted so that the near-infrared transmittance at the wavelength of 850 nm falls within the desired range.

In the above general formula that expresses tungsten bronze contained in electromagnetic wave absorbing particles according to the present embodiment, the element(s) M can contain at least one or more species selected from among K, Rb, and Cs. This is because the element(s) M containing one or more species selected from among K, Rb, and Cs makes it easier to form a hexagonal tungsten bronze structure.

It is also possible that the element(s) M further includes one or more species selected from among Na, Tl, In, Li, Be, Mg, Ca, Sr, Ba, Al, and Ga as an additive element(s).

In the above general formula, x represents the ratio of the element(s) M to W (atomic ratio), and denotes the amount of the element(s) M to be added, which can be set to be greater than or equal to 0.15 and less than or equal to 0.33. This is because in the case where all the gaps in the hexagonal tunnels are occupied by the element(s) M, x becomes 0.33. This is also because by setting x to be greater than or equal to 0.15, the solar transmittance can be controlled sufficiently, which is favorable.

Also, in the above general formula, y represents the amount of oxygen deficiency in 3-y representing a ratio of O to W (atomic ratio), which can be set to be greater than 0. This is because by introducing oxygen deficiency, the solar transmittance can be controlled sufficiently, which is favorable. However, if oxygen deficiency is introduced excessively, decomposition to lower oxides such as $WO_2$ or metal W begins, and this may make it difficult to maintain the hexagonal skeleton. Also, the near-infrared transmittance at the wavelength of 850 nm may be decreased excessively. Therefore, in order to securely maintain the hexagonal crystal skeleton and to increase the transmittance of near-infrared light having a wavelength of 850 nm, it is favorable that y indicating the oxygen deficiency is less than or equal to 0.46.

Also, the inventors of the present invention have conducted further investigations, and found that the added amount of the element(s) M and the amount of oxygen deficiency correlate with the lattice constants of the tungsten bronze crystal.

In tungsten bronze, d-electrons are imperfectly filled and crystal anisotropy appears; therefore, when W-5d forms an antibonding hybrid orbit with O-2p, in order to compensate for an increase in the crystal energy, so-called "Jahn-Teller distortion" is generated, in which the atomic positions of the element(s) M and O change by minute amounts.

Due to the Jahn-Teller effect, in tungsten trioxide ($WO_3$) as the primitive form of tungsten bronze, the crystal normally expected to be cubic is distorted into a monoclinic crystal. Walkingshaw et al. have shown by DFT (density functional theory) calculation (Non-Patent Document 1) that when electrons are supplied to this W-5d/O-2p antibonding hybrid orbit, the Jahn-Teller distortion is alleviated, and the crystal structure and the lattice constants change systematically. Their calculation results reproduce change in the crystal structure of $Na_xWO_3$ that has been experimentally observed, namely, when x increases from 0 to 1, the crystal structure changes from a monocline to an orthorhombus, a tetragon, and a cubic crystal.

The inventors of the present invention thought that this phenomenon would also be observed in hexagonal tungsten bronze. In the case where the element(s) M contains one or more species selected from among K, Rb, and Cs in tungsten bronze expressed by the general formula $M_xWO_{3-y}$ having a hexagonal structure, the ion radius of the element(s) M is large; therefore, the $WO_6$ octahedron is arranged to be hexagonally symmetrical, large hexagonal tunnels are formed therein, and the ions of the element(s) M are stored in gaps of the hexagonal tunnels. Further, at this time, the Jahn-Teller distortion should naturally be retained in the skeleton formed by the $WO_6$ octahedrons that constitute the tungsten bronze.

Thereupon, structural changes in tungsten bronze having hexagonal crystals expressed by the general formula $M_xWO_{3-y}$ were precisely analyzed with a Rietveld method using XRD patterns when the added amount x of the element(s) M and the amount y of oxygen deficiency were changed. As a result, the inventors of the present invention found that various parameters characterizing the $WO_6$ octahedron, such as the lattice constants and the W—O distance, direct toward those of a regular octahedron while the added amount of the element(s) M and the amount of oxygen deficiency increases, namely, found that the Jahn-Teller distortion is alleviated linearly.

Here, an example of a distribution of lattice constants is illustrated in FIG. 1, in which the added amount x of the element(s) M and the amount y of oxygen deficiency are changed in a hexagonal tungsten bronze expressed by the formula $M_xWO_{3-y}$.

In FIG. 1, a distribution of lattice constants (changes) when x and y in the above general formula are changed is illustrated in a coordinate space in which the horizontal axis represents the lattice constant a(Å), the vertical axis represents the lattice constant c(Å), to represent a coordinate position by (the lattice constant a, the lattice constant c) in the case of the element M being one of Cs, Rb, and K. In FIG. 1, a dashed line 10 corresponds to an approximate line that is drawn in accordance with the distribution of the lattice constants a and c when x and y are changed in the case of the element M being Cs, namely, in the case of a hexagonal cesium tungsten bronze expressed by $Cs_xWO_{3-y}$.

Dashed lines 11 and 12 correspond to approximate lines that are drawn in accordance with the distributions of similar lattice constants a and c in the cases of the elements M being Rb and K, respectively.

From FIG. 1, it can be seen that the lattice constants change on the straight lines corresponding to the species of the elements M as the numerical values of x and y change. Note that according to investigations conducted by the inventors of the present invention, the same behavior was observed regardless of the manufacturing method and/or the raw materials.

Figure 2:
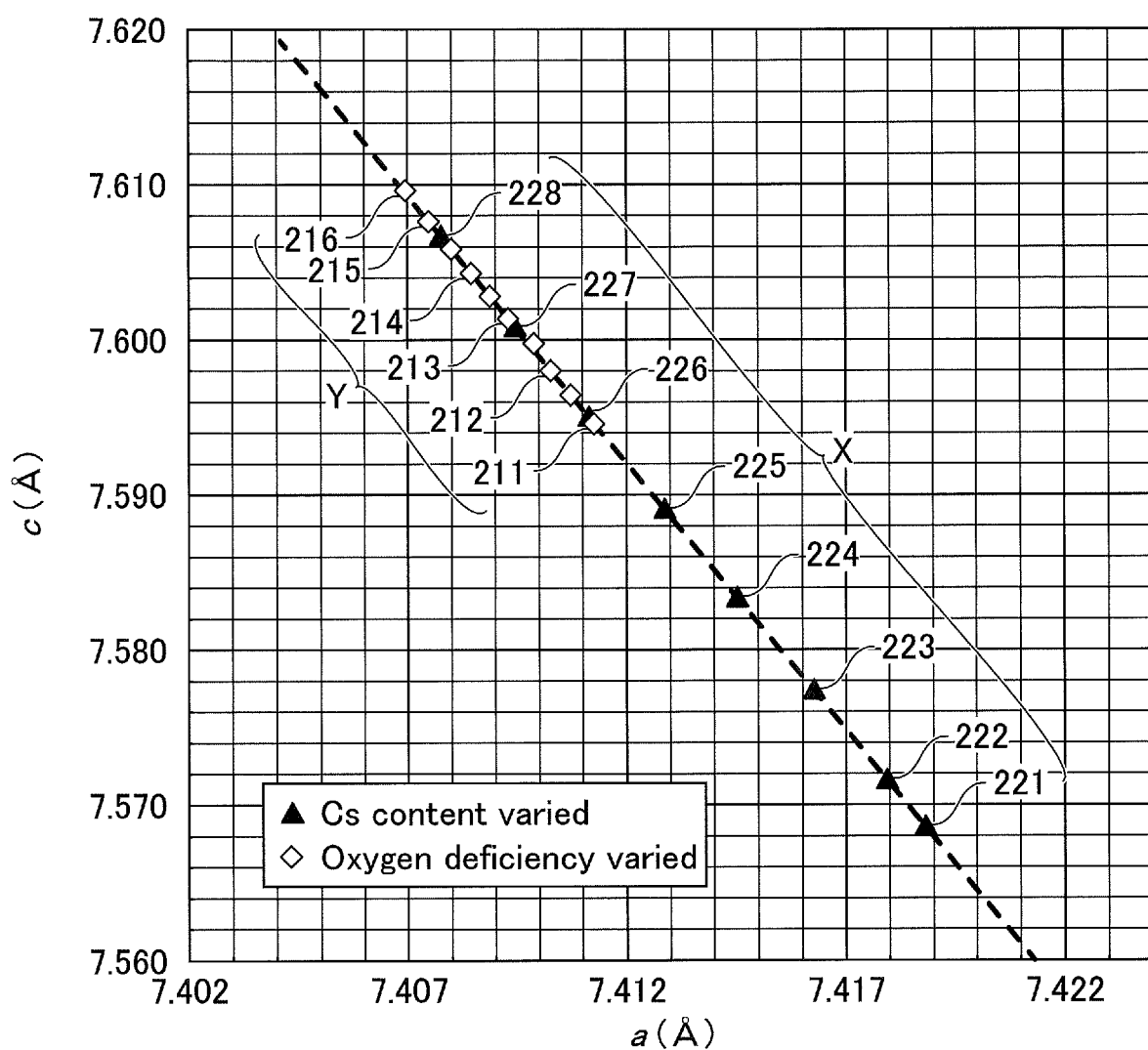
FIG. 2 is an explanatory diagram of correlation between the composition of tungsten bronze and the lattice constants in the case of the element M being Cs.

Here, in FIG. 2, for $Cs_xWO_{3-y}$, an example of a distribution of the lattice constants when the added amount x of the element(s) M and the amount y of oxygen vacancy is changed is illustrated. In FIG. 2, results are also illustrated in a coordinate space in which the horizontal axis represents the lattice constant a(Å), the vertical axis represents the lattice constant c(Å), to represent a coordinate position by (the lattice constant a, the lattice constant c) as in the case of FIG. 1.

Suppliers of electrons to the W-5d orbit of the crystal of $Cs_xWO_{3-y}$ to alleviate the Jahn-Teller distortion are $Cs^+$ ions as ions of the element M and the oxygen deficiency $V_O$, and these amounts have relevance to x and y in the above formula.

In FIG. 2, when the added amount x of Cs as the element M is set constant at 0.32, and the amount y of oxygen deficiency is changed from 0 to 0.46, the distribution of lattice constants is designated with points 211 to 216. In other words, the points 211 to 216 correspond to the composition that is expressed by $Cs_{0.32}WO_{3-y}$. Specifically, 3-y in the formula corresponds to 3.00 at the point 211, 2.90 at the point 212, 2.80 at the point 213, 2.70 at the point 214, 2.60 at the point 215, and 2.54 at the point 216.

Also, in FIG. 2, when the reduction conditions are set constant as at 550° C. for 1 hour in a 1% $H_2$—$N_2$ air stream, and the added amount of Cs as the element M was changed from 0.19 to 0.32, the distribution of lattice constants is designated with points 221 to 228. In other words, the points 221 to 228 correspond to the composition that is expressed by $CS_xWO_{2.63-2.76}$. When the amount of Cs decreases, even under the same amount of oxygen deficiency, the molar ratio to the entirety changes; therefore, the O/W changes from 2.63 to 2.76. Then, x in the formula corresponds to 0.19 at the point 221, 0.20 at the point 222, 0.22 at the point 223, 0.24 at the point 224, 0.26 at the point 225, 0.28 at the point 226, 0.30 at the point 227, and 0.32 at the point 228.

An approximation line was drawn for the distribution of lattice constants described above, and it was confirmed that all points were arranged almost linearly as illustrated in FIG. 2.

In addition, it was confirmed that the lattice constants were distributed along the following formula (A).

$$c(Å)=-3.436a(Å)+33.062 \quad (A)$$

Also, the constants move toward the lower right side of the approximate line when the Jahn-Teller distortion is large, and move toward the upper left side when the distortion is small.

When the reduction conditions such as oxygen reduction time are set constant and the added amount of Cs as the added amount of the element M is increased, the constants change significantly from the point 221 to the point 228 in FIG. 2, namely, within a region X in FIG. 2.

On the other hand, when the added amount of Cs as the added amount of the element M is set constant at 0.32 and the amount y of oxygen deficiency is increased, the constants change from the point 211 to the point 216 in FIG. 2, namely, in a small range within a region Y in FIG. 2.

When cesium tungsten bronze is decreased so as to increase the amount of oxygen deficiency to be greater than in the case of the point 216, although decomposition to $WO_2$ as a lower oxide and metal W begins, the amount y of oxygen deficiency in cesium tungsten bronze does not go beyond the case of the point 216.

Comparing the lengths of the region X and the region Y, it is obvious that the change in the lattice constants when the amount y of oxygen deficiency changes from the point 211 to the point 216 by 0.46, is smaller than the change in the lattice constants when the added amount of Cs as the added amount x of the element M changes from the point 221 to the point 228 by 0.13. Specifically, the length of the region Y is 1/2.6 times the length of the region X.

This is because the amount of free electrons released by the introduction of the oxygen deficiency $V_O$ is smaller than the amount of free electrons released by the addition of the element M.

Jahn-Teller distortion depends only on the amount of electrons; therefore, the chart illustrated in FIG. 2 can be used for any values of x and y as long as the element M remains the same as Cs.

For example, when the amount of oxygen deficiency is set constant at the maximum (y=0.46), the change in the lattice constants when the added amount x of Cs as the added amount of the element M changes between 0.19 and 0.32 corresponds to a change from the point 222 to the point 216 in the figure. This is because it is possible to derive a range of the lattice constants without changing the width of region X as the change width when the added amount of Cs as the added amount of the element M is changed, by sliding the range so as to start from the point 216 where the content of oxygen deficiency is maximum.

In the case where the added amount x of Cs as the added amount of the element M is set constant at 0.26 and the amount y of oxygen deficiency is changed from 0 to 0.46, it is possible to derive a range of lattice constants without changing the width of the region Y, by sliding the region Y so that a point of the region Y at which the amount of oxygen 3-y is 2.63 corresponds to the point 225 at which the added amount x of Cs is 0.26. Note that at the point 225, the amount of oxygen 3-y is 2.63; therefore, the region Y is slid so that the point at which the amount of oxygen 3-y is 2.63 corresponds to the point 225 as described above.

As described above, the lattice constants of tungsten bronze correspond to the composition, and for example, in the case where the added amount of the element M is known, by measuring the lattice constants, it is possible to determine the amount y of oxygen deficiency and the like. This method is useful because tungsten bronze is very easily oxidized and the oxidation state changes subtly depending on the raw materials and the manufacturing conditions.

In the case of the element M being Cs, it is generally favorable that the lattice constant c falls within $7.576 \leq c \leq 7.610$. In particular, the strongest near-infrared absorption effect and particularly high controllability of the solar transmittance are obtained with constants in a region close to the point 216 where the added amount of Cs as the element M is large and the amount of oxygen deficiency is large. In other words, a region where the lattice constant c falls within $7.594 \leq c \leq 7.610$ is more favorable.

However, as described above, if the amount of oxygen deficiency becomes too large, the transmittance of electromagnetic waves at the wavelength of 850 nm may be decreased. Therefore, in order to increase the near-infrared transmittance at the wavelength of 850 nm in particular while controlling the solar transmittance, it is more favorable to perform control so that the added amount of Cs as the element M and the oxygen deficiency do not become excessively large. Therefore, it is further favorable that in the case of the element M being Cs, the lattice constant c falls within $7.594 \leq c \leq 7.600$.

Here, although the case of the element M being Cs has been described as an example, as illustrated in FIG. 1, even in the case of the element M being Rb or K, the lattice constants change linearly by changing the composition similarly.

Specifically, in the case of the element M being Rb, the constants change along a line of $c=-3.344a+32.265$ designated by the dashed line 11. Also, in order to increase the transmittance of near-infrared rays having a wavelength of 850 nm in particular while controlling the solar transmittance, it is favorable to control the oxygen deficiency so as not to be excessively large; therefore, in the case of the element M being Rb, it is favorable that the lattice constant c falls within $7.517 \leq c \leq 7.580$, and it is more favorable to fall within $7.517 \leq c \leq 7.560$.

Also, in the case of the element M being K, the constants change along a line of $c=-2.9391a+29.227$ designated by the dashed line 12. Also, in order to increase the transmittance of near-infrared rays having a wavelength of 850 nm in particular while controlling the solar transmittance, it is favorable to control the oxygen deficiency so as not to be excessively large; therefore, it is favorable that the lattice constant c falls within $7.504 \leq c \leq 7.564$, and it is more favorable to fall within $7.504 \leq c \leq 7.544$.

Also, the element(s) M is not limited to a single species, and may include multiple elements. For example, part of Cs in cesium tungsten bronze in which the element M is Cs can be substituted with Rb. In this case, Rb substitutes the Cs sites in the cesium tungsten bronze to become an all proportional solid solution.

An approximate line of the distribution of lattice constants of cesium-rubidium tungsten bronze in which part of Cs is substituted with Rb, depending on the amount of substitution with Rb, for example, in FIG. 1, corresponds to a line obtained by translating the dashed line 10 as an approximate line of the distribution of lattice constants of cesium tungsten bronze in the direction toward the dashed line 11 as an approximate line of the distribution of lattice constants of rubidium tungsten bronze.

Similarly, in the case where part of Rb in rubidium tungsten bronze is substituted with K, an approximate line of the distribution of lattice constants of rubidium-potassium tungsten bronze, depending on the amount of substitution with K, for example, in FIG. 1, corresponds to a line obtained by translating the dashed line 11 as an approximate line of the distribution of lattice constants of rubidium tungsten bronze in the direction toward the dashed line 12 as an approximate line of the distribution of lattice constants of potassium tungsten bronze.

Tungsten bronze contained in electromagnetic wave absorbing particles according to the present embodiment contains at least one or more species selected from among K, Rb, and Cs as the element(s) M as described above. A tungsten bronze structure also appears when added with not only one or more species selected from among K, Rb, and Cs, but also the other alkali metals, Li and Na; In and Tl as the 13th group of elements; Be, Mg, Sr, Ba, and Ca as the alkaline earth metals; Ti, V, Zr, and Nb as the transition metals; Cu, Ag, Au, and Pt as the precious metals; and the like. Therefore, the element(s) M can further include one or more species selected from among Na, Tl, In, Li, Be, Mg, Ca, Sr, Ba, Al, and Ga as an additive element(s). According to investigations conducted by the inventors of the present invention, in the case of adding these additive elements, in order to increase the transmittance of near-infrared rays having a wavelength of 850 nm in particular while controlling the solar transmittance, it is favorable that the lattice constants are distributed between the dashed line 10 and the dashed line 12 in FIG. 1.

In particular, it is more favorable that the lattice constants are positioned in the quadrangular region ABCD connecting the points A(7.406, 7.614), B(7.372, 7.564), C(7.393, 7.504), and D(7.423, 7.554).

However, lattice constants calculated from XRD patterns are influenced by various factors not only by the history, shape, size, and distribution of particle sizes of the target material itself, but also the device used for XRD measurement, the width of an x-ray slit, spread of diffraction lines, and the type of reference samples, and the like. The inventors of the present invention obtain data using a precisely calibrated device, and in the case of cesium tungsten bronze and rubidium tungsten bronze, based on a space group $P6_3/mcm$, a Rietveld analysis is carried out to calculate the lattice constants. Also, in the case of potassium tungsten bronze, a Rietveld analysis is carried out based on a space group $P6_322$ to calculate the lattice constants.

However, industrially, it is favorable to design the lattice constants taking into account variation. Therefore, for each point in the above region, it is favorable to consider a width of ±0.006 Å for the lattice constant a, and a width of ±0.01 Å for the lattice constant c.

Also, according to investigations conducted by the inventors of the present invention, the lattice constants may change in the case where electromagnetic wave absorbing particles become finer particles. For example, in the case of applying a crushing process to a bulk to mechanically produce nanoparticles, the oxygen deficiency is decreased due to the influence of strong pressure and shear deformation. Also, in the case of tungsten bronze, elimination regions of the element M appear on the particle surfaces. These changes decrease x and y in the general formula of tungsten bronze described above, and thereby, the Jahn-Teller distortion becomes greater; therefore, as for the lattice constants, it was expected that the lattice constant in the a-axis direction would increase, whereas the lattice constant in the c-axis direction would decrease. However, what the experiment showed was the opposite. Specifically, as for the lattice constants, while the particles become finer, it was confirmed that the lattice constant in the a-axis direction was decreased along the line illustrated in FIG. 1, and the lattice constant in the c-axis was displaced in the increasing direction.

As a result of experiments conducted by the inventors of the present invention with respect to nanoparticles ranging from greater than or equal to 10 nm and less than or equal to 40 nm, the mean displacements of the lattice constants compared with those before becoming finer particles were $\Delta a=-0.0024$ Å and $\Delta c=+0.0084$ Å. This indicates that the Jahn-Teller distortion is significantly alleviated by the crystal size effect when the particle diameter becomes nanosized from a bulk. Therefore, in addition to the industrial variation described above, it is favorable to take into account changes in the lattice constants in the case of finer particles, by considering, for each point in the above region, a width of ±0.0084 Å for the lattice constant a, and a width of ±0.0184 Å for the lattice constant c.

As described above, it is favorable that $a_{M\text{-}HTB}$(Å) and $C_{M\text{-}HTB}$(Å) as the lattice constants a and c for hexagonal tungsten bronze contained in electromagnetic wave absorbing particles according to the present embodiment, satisfies the following rules.

In the coordinate space wherein the horizontal axis represents the lattice constant a(Å), the vertical axis represents the lattice constant c(Å), to represent a coordinate position by (the lattice constant a, the lattice constant c), it is more favorable that the lattice constants have the following relationships of formulas (1) and (2) with a point $(a_M, c_M)$ positioned in the quadrangular region ABCD connecting the points A(7.406, 7.614), B(7.372, 7.564), C(7.393, 7.504), and D(7.423, 7.554).

$$a_{M\text{-}HTB}=a_M\pm0.0084 \quad (1)$$

$$c_{M\text{-}HTB}=c_M\pm0.0184 \quad (2)$$

The lattice constants of tungsten bronze contained in electromagnetic shielding particles according to the present embodiment falling within predetermined ranges in this way mean that the element(s) M and the oxygen deficiency fall within the predetermined ranges at the level of atomic arrangement. Therefore, it is possible to obtain electromagnetic wave absorbing particles having excellent near-infrared transmission characteristics with respect to the wavelength of 850 nm while controlling the solar transmittance, which is favorable.

In particular, in the case of cesium tungsten bronze in which the element M is Cs, in the coordinate space wherein the horizontal axis represents the lattice constant a(Å), the vertical axis represents the lattice constant c(Å), to represent a coordinate position by (the lattice constant a, the lattice constant c), it is favorable for $a_{M\text{-}HTB}$(A) and $C_{M\text{-}HTB}$(A) as the lattice constants a and c for the hexagonal tungsten bronze, to have the following relationships of formulas (3) and (4) with a point $(a_{Cs}, c_{Cs})$ positioned on a straight line of $c_{Cs}=-3.436a_{Cs}+33.062$.

$$a_{M\text{-}HTB}=a_{Cs}\pm0.0084 \quad (3)$$

$$c_{M\text{-}HTB}=c_{Cs}\pm0.0184 \quad (4)$$

Note that in order to increase the transmittance of near-infrared rays having a wavelength of 850 nm in particular while controlling the solar transmittance, it is more favorable for $c_{Cs}$ to satisfy $7.576 \leq c_{Cs} \leq 7.610$.

Also, in the case of rubidium tungsten bronze in which the element M is Rb, in the coordinate space wherein the horizontal axis represents the lattice constant a(Å), the vertical axis represents the lattice constant c(Å), to represent a coordinate position by (the lattice constant a, the lattice constant c), it is favorable for $a_{M\text{-}HTB}$(Å) and $C_{M\text{-}HTB}$(Å) as the lattice constants a and c for the hexagonal tungsten bronze, to have the following relationships of formulas (5) and (6) with a point $(a_{Rb}, c_{Rb})$ positioned on a straight line of $c_{Rb}=-3.344a_{Rb}+32.265$.

$$a_{M\text{-}HTB}=a_{Rb}\pm0.0084 \quad (5)$$

$$c_{M\text{-}HTB}=c_{Rb}\pm0.0184 \quad (6)$$

Note that in order to increase the transmittance of near-infrared rays having a wavelength of 850 nm in particular while controlling the solar transmittance, it is more favorable for $C_{Rb}$ to satisfy $7.517 \leq c_{Rb} \leq 7.580$.

Also, in the case of potassium tungsten bronze in which the element M is K, in the coordinate space wherein the horizontal axis represents the lattice constant a(Å), the vertical axis represents the lattice constant c(Å), to represent a coordinate position by (the lattice constant a, the lattice constant c), it is favorable for $a_{M\text{-}HTB}$(Å) and $C_{M\text{-}HTB}$(Å) as the lattice constants a and c for the hexagonal tungsten bronze, to have the following relationships of formulas (7) and (8) with a point $(a_K, c_K)$ positioned on a straight line of $c_K=-2.9391a_K+29.227$.

$$a_{M\text{-}HTB}=a_K\pm0.0084 \quad (7)$$

$$c_{M\text{-}HTB}=c_K\pm0.0184 \quad (8)$$

Note that in order to increase the transmittance of near-infrared rays having a wavelength of 850 nm in particular while controlling the solar transmittance, it is more favorable for $c_K$ to satisfy $7.504 \leq c_K \leq 7.564$.

The interatomic distance also reflects alleviation of the Jahn-Teller distortion caused by the addition of the element(s) M and introduction of oxygen deficiency. As described above, the Jahn-Teller distortion is retained in the skeleton formed by $WO_6$ octahedrons in tungsten bronze having a hexagonal structure, and the $WO_6$ octahedrons are not isotropic octahedrons. In other words, the distances from a W atom at the center to the surrounding O atoms are different from each other.

For example, Oi et al. synthesized a hexagonal tungsten oxide (h-$WO_3$) without the dope element M and oxygen deficiency, which corresponds to x=0 and y=0, and carried out a Rietveld analysis assuming the space group $P6_3/mcm$ to obtain the lattice constants, atomic positions, and interatomic distances in the crystal phase (Non-Patent Document 2). According to this report, among the W—O distances in a $WO_6$ octahedron, there are two distances from [an O atom present in the c-axis direction when viewed from the W atom] to [the W atom at the center], which are 1.80 Å and 2.13 Å, respectively, and the ratio is 1.18. In other words, in the case where there is no supply of electrons by the dope element M and oxygen deficiency, the ratio of the W—O distances becomes greater due to the Jahn-Teller distortion.

As described above, the inventors of the present invention analyzed structural changes in tungsten bronze having hexagonal crystals expressed by the general formula $M_xWO_{3-y}$, when the added amount x of the element(s) M and the amount y of oxygen deficiency were changed. Then, from a result of a precise analysis using the Rietveld method, coordinates of atoms were obtained to calculate the W—O distances in a $WO_6$ octahedron contained in a crystal of the tungsten bronze having hexagonal crystals. As a result, the inventors found that while the added amount of the element(s) M and the amount of oxygen deficiency were increased, the Jahn-Teller distortion was linearly alleviated, and the ratio of the W—O distances described above became smaller.

Further, the inventors found that in the $WO_6$ octahedron present in a crystal of hexagonal tungsten bronze, by having the ratio of the maximum value to the minimum value among the distances from [an O atom present in the c-axis direction when viewed from the W atom] to [the W atom at the center] (the maximum value/the minimum value) set within a predetermined range, the transmittance of near-infrared rays having a wavelength of 850 nm can be increased in particular while controlling the solar transmittance.

Specifically, a case of the ratio greater than or equal to 1.00 and less than or equal to 1.10 is favorable because it is possible to appropriately control the added amount of element M and the amount of oxygen deficiency to increase the transmittance of near-infrared rays having a wavelength of 850 nm in particular while controlling the solar transmittance.

Although the mean particle diameter of electromagnetic wave absorbing particles according to the present embodiment is not limited in particular, it is favorable to be greater than or equal to 0.1 nm and less than or equal to 100 nm.

This is because by making the mean particle diameter of electromagnetic wave absorbing particles less than or equal to 100 nm, the near-infrared absorption characteristics can be particularly increased, namely, the solar transmittance can be particularly controlled. This is also because by making the mean particle diameter of electromagnetic wave absorbing particles greater than or equal to 0.1 nm, it becomes industrially easier to manufacture the particles.

Note that, for example, as in the case of windshields of automobiles, in the case of an application in which transparency in the visible light region is important, it is favorable to further consider decrease of scattering caused by electromagnetic wave absorbing particles. In the case where decrease of scattering is important, it is particularly favorable that the mean particle diameter of electromagnetic wave absorbing particles is less than or equal to 30 nm.

The mean particle diameter means a particle diameter at a cumulative value of 50% in a particle size distribution, and means the same also in the other parts of the present description. As a method of measuring a particle size distribution to calculate the mean particle diameter, direct measurement of the particle diameter for each particle using, for example, a transmission electron microscope can be used.

Also, surface treatment may be applied to electromagnetic wave absorbing particles according to the present embodiment for purposes including surface protection, durability improvement, oxidation protection, water resistance improvement, and the like. Although the specific contents of surface treatment are not limited in particular, for example, the surface of an electromagnetic wave absorbing particle according to the present embodiment can be modified with a compound containing one or more species of elements selected from among Si, Ti, Zr, and Al. At this time, as the compound containing one or more species of elements selected from among Si, Ti, Zr, and Al, one or more species selected from among oxide, nitride, carbide, and the like may be listed.

[Manufacturing Method of Electromagnetic Wave Absorbing Particles]

An example of a configuration of a manufacturing method of electromagnetic wave absorbing particles according to the present embodiment will be described.

Note that electromagnetic wave absorbing particles described above can be manufactured by the manufacturing method of electromagnetic wave absorbing particles according to the present embodiment; therefore, the description of some of the matters already described will be omitted.

The manufacturing method of electromagnetic wave absorbing particles according to the present embodiment is not limited in particular, and a variety of methods can be used as long as a predetermined composition and a predetermined oxygen vacancy concentration can be obtained. As the manufacturing method of electromagnetic wave absorbing particles according to the present embodiment, a synthetic method in a reducing gas stream; a method of solid-phase reduction reaction; a method of oxidizing tungsten bronze obtained by a solid-phase reaction, liquid phase method, or gas phase method using an oxygen-containing gas; a method of applying reducing treatment using reducing gas flow; a method of reducing $WO_3$ in a molten alkali halide; or the like may be listed.

(1) Synthetic Method in a Reducing Gas Stream

As the manufacturing method of electromagnetic wave absorbing particles according to the present embodiment, for example, a synthetic method in a reducing gas stream can be used. In this case, the manufacturing method of electromagnetic wave absorbing particles according to the present embodiment may include a heating step in which a mixture of raw materials containing the element(s) M (where the element(s) M includes at least one or more species selected from among K, Rb, and Cs) and W, where the atomic ratio M/W between the element(s) M and W is x ($0.15 \leq x \leq 0.33$) are heated at a solid-phase reaction temperature higher than or equal to 400° C. and lower than or equal to 650° C. in the air stream of a reducing gas to cause a solid-phase reaction.

Also, in this case, it is favorable that the manufacturing method of electromagnetic wave absorbing particles according to the present embodiment further includes a homogenization step of performing heat treatment at a temperature higher than the solid-phase reaction temperature, e.g., higher than or equal to 700° C. and lower than or equal to 900° C.

As the raw materials, for example, an aqueous solution of $M_2CO_3$ (an aqueous solution containing carbonate of the element M) and $H_2WO_4$ (tungstic acid) may be used. Note that in the case where the multiple elements of M are contained, multiple corresponding aqueous solutions of $M_2CO_3$ can be used.

The raw material mixture to which the heating step is to be applied is obtained by mixing and kneading the aqueous solution of $M_2CO_3$ and $H_2WO_4$ at a ratio x ($0.15 \leq x \leq 0.33$) of M/W as the atomic ratio. Also, it is favorable to dry the raw material mixture in the atmosphere before the heating step.

In the heating step, $M_xWO_{3-y}$ as tungsten bronze can be prepared by heating at a solid-phase reaction temperature higher than or equal to 400° C. and lower than or equal to 650° C. in a gas stream of a reducing gas to cause a solid-phase reaction.

In the case of x=0.33, the reaction formula is expressed by the following formula:

$$0.165 M_2CO_3 + H_2WO_4 + (0.165+y)H_2 \rightarrow 0.165 CO_2\uparrow + (1.165+y)H_2O\uparrow + M_{0.33}WO_{3-y}$$

In the homogenization step, the heat treatment may be carried out at a temperature that is higher than the solid-phase reaction temperature of the heating step, for example, higher than or equal to 700° C. and lower than or equal to 900° C. The homogenization step may be carried out in an inert gas atmosphere, for example, nitrogen, argon, or the like.

(2) Solid Phase Reduction Reaction Method

Also, electromagnetic wave absorbing particles according to the present embodiment may be produced by a solid phase reduction reaction method.

In this case, the manufacturing method of electromagnetic wave absorbing particles according to the present embodiment may include a heating and reduction step in which the raw material mixture is heated at a temperature higher than or equal to 750° C. and lower than or equal to 950° C. under a vacuum atmosphere or inert gas atmosphere.

Note that as the raw material mixture, $WO_3$; one or more species selected from among $M_2CO_3$ and $M_2WO_4$ (where the element(s) M includes at least one or more species selected from among K, Rb, and Cs); and one or more species selected from among a simple substance of tungsten and a tungsten oxide whose atomic number ratio of O/W is less than 3 may be included, and x as the atomic number ratio M/W of the element(s) M and W may be set to be $0.15 \le x \le 0.33$.

In order to achieve the stoichiometry of the composition including oxygen in reaction among the raw materials in a closed system, in the case of heating in a vacuum or under an inert gas atmosphere, it is favorable to contain a reducing component as a raw material. Specifically, as described above, as the raw materials, in addition to $WO_3$ and at least one species selected from among $M_2CO_3$ and $M_2WO_4$ as the reducing component as described above, it is favorable to use one or more species selected from among a simple substance of tungsten and a tungsten oxide whose atomic number ratio of O/W less than 3 (e.g., one or more species selected from among W, $WO_2$, and $WO_{2.72}$)

Then, by weighing and mixing the components of the raw materials, and performing the heating and reduction step of heating in a vacuum or under an inert gas atmosphere at a temperature higher than or equal to 750° C. and lower than or equal to 950° C., $M_xWO_{3-y}$ can be synthesized. Heating may be carried out in a vacuum-sealed quartz tube; heating may be carried out in a vacuum calcination furnace; or heating may be carried out in an inert gas atmosphere of nitrogen or the like. Note that in the case of using an inert gas, heating may be carried out under an air stream of the inert gas. An ideal reaction formula in the case of using $WO_3$, $M_2WO_4$, and a simple substance of tungsten W as the raw materials is expressed by the following formula.

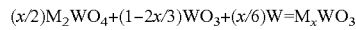

$$(x/2)M_2WO_4+(1-2x/3)WO_3+(x/6)W=M_xWO_3$$

However, although the stoichiometry of oxygen should be achieved by solid-phase reactions among the raw materials, normally, oxygen deficiency is introduced and $M_xWO_{3-y}$ is formed. The reason for this can be attributed to $M_2CO_3$ and $M_2WO_4$, each of which is one of the raw materials. $M_2CO_3$ and $M_2WO_4$ tend to absorb moisture during weighing at room temperature, to become deliquescent. If letting the solid-phase reaction to proceed with such raw materials, water that has been mixed in response to the moisture in the atmosphere evaporates to act as a reducing agent; therefore, $M_xWO_{3-y}$ having oxygen deficiency is generated.

$M_xWO_{3-y}$ is highly reductive; therefore, ideas are required in order to produce samples that have very low or no oxygen deficiency. In this case, the raw material $M_2WO_4$ needs to be weighed in a dry environment in a glove box, and handled so as not to absorb moisture. For example, in the case of heating in a vacuum calcination furnace, although it is heated and calcined at a temperature higher than or equal to 750° C. and lower than or equal to 950° C., in the case where the hold time in vacuum at high temperature is longer than several days, there may be a case where reduction of $M_xWO_{3-y}$ proceeds to a fully reduced state, namely, y becomes 0.46. Further, in the case of using a crucible of a carbon material, reduction may proceed at a part contacting carbon.

As such, the hygroscopicity of the raw materials $M_2CO_3$ and $M_2WO_4$ and the conditions when carrying out the heat treatment in the heating and reduction step are important factors that affect the amount of oxygen deficiency in $M_xWO_{3-y}$ to be obtained. Therefore, to control the amount y of oxygen deficiency in $M_xWO_{3-y}$ to be a particularly low value, it is favorable to pay sufficient attention to the raw materials, humidity in the atmosphere, hold time in vacuum, material of the crucible, and the like.

(3) Method of Oxidizing or Reducing Tungsten Bronze

As the manufacturing method of electromagnetic wave absorbing particles according to the present embodiment, a method of oxidizing tungsten bronze using an oxidizing gas or a method of reducing tungsten bronze using a reducing gas may also be listed.

In this case, the manufacturing method of electromagnetic wave absorbing particles according to the present embodiment may include an annealing step in which tungsten bronze including oxygen deficiency expressed by the general formula: $M_xWO_{3-y}$ (where one or more elements M include at least one or more species selected from among K, Rb, and Cs, $0.15 \le x \le 0.33$, and $0<y \le 0.46$) is placed in a crucible made of a non-reducing material, and is annealed at a temperature higher than or equal to 300° C. and lower than or equal to 650° C. in an oxidizing gas atmosphere.

Also, the manufacturing method of electromagnetic wave absorbing particles according to the present embodiment may include an annealing step in which tungsten bronze including oxygen deficiency expressed by the general formula: $M_xWO_{3-y}$ (where one or more elements M include at least one or more species selected from among K, Rb, and Cs, $0.15 \le x \le 0.33$, and $0<y \le 0.46$) is annealed at a temperature higher than or equal to 300° C. and lower than or equal to 650° C. in a reducing gas atmosphere.

In the method of oxidizing tungsten bronze, a tungsten bronze that has a greater amount of oxygen deficiency than the desired tungsten bronze may be heated in an oxidizing gas atmosphere to decrease the amount of oxygen deficiency so as to achieve the desired value.

As the oxidizing gas, an oxygen-containing gas may be used. Although the amount of oxygen in the oxygen-containing gas is not limited in particular, it is favorable to contain oxygen by greater than or equal to 18 vol % and less than or equal to 100 vol %. As the oxidizing gas, it is favorable to use, for example, the atmosphere (air) or oxygen gas.

In the method of reducing tungsten bronze, a tungsten bronze that has a smaller amount of oxygen deficiency than the desired tungsten bronze may be heated in a reducing gas atmosphere to increase the amount of oxygen deficiency so as to achieve the desired value. Note that in the case of carrying out the reduction, it is favorable to carry out under an air flow of the reducing gas.

As the reducing gas, a mixed gas that contains a reducing gas such as hydrogen and inert gas can be used.

Note that the manufacturing method of tungsten bronze to which oxidation or reduction is to be applied is not limited in particular.

For example, as the manufacturing method of tungsten bronze, a thermal plasma method may be used.

When synthesizing tungsten bronze by a thermal plasma method, a powder mixture of a tungsten compound and a compound of the element(s) M can be used as the raw materials.

As the tungsten compound, it is favorable to use one or more species selected from among tungstic acid ($H_2WO_4$), ammonium tungstate, tungsten hexachloride, and a tungsten hydrate obtained by adding water to tungsten hexachloride dissolved in alcohol to be hydrolyzed, and then, evaporating the solvent.

Also, as the compound of the element(s) M, it is favorable to use one or more species selected from among oxides, hydroxides, nitrates, sulfates, chlorides, and carbonates of the element(s) M.

An aqueous solution containing the tungsten compound described above and the compound of the element(s) M described above are wet-mixed so that the ratio of the element(s) M and the element W becomes $M_xW_yO_z$ (where M represents the element(s) M, W represents tungsten, O represents oxygen, $0.001 \leq x/y \leq 1.0$, and $2.0 \leq z/y \leq 3.0$). Then, by drying the obtained mixed solution, a powder mixture of the compound of the element(s) M and the tungsten compound is obtained. Then, the powder mixture can be used as the raw material for the thermal plasma method.

Also, a composite tungsten oxide obtained by applying a first calcination step to the powder mixture under an inert gas alone or a mixed gas atmosphere of inert gas and a reducing gas, can also be used as the raw material for the thermal plasma method. Other than the above, a composite tungsten oxide obtained by applying two-step calcination to the powder mixture, in which a first calcination step is carried out under a mixed gas atmosphere of an inert gas and a reducing gas, and a second calcination step is carried out under an inert gas atmosphere for the calcined material obtained in the first calcination step, can also be used as the raw material for the thermal plasma method.

Although the thermal plasma used in the thermal plasma method is not limited in particular, and it is possible to use, for example, one or more species selected from among one of DC are plasma, radio-frequency plasma, microwave plasma, or low-frequency AC plasma; a superimposed plasm of these plasmas; a plasma generated by an electrical method in which a magnetic field is applied to a DC plasma; a plasma generated by irradiation with a high-power laser; a plasma generated by a high-power electron beam or ion beam; and the like.

However, whatever the thermal plasma is used, it is favorable to be a thermal plasma having a high temperature part of 10000 to 15000K, in particular, to be a plasma with which the time to generate fine particles can be controlled.

The raw materials supplied into the thermal plasma having the high temperature part instantaneously evaporate at the high temperature part. Then, the evaporated raw materials are condensed during the course of reaching the tail flame part of the plasma and rapidly solidified outside of the plasma flame, and thus, tungsten bronze can be generated.

Further, as the manufacturing method of tungsten bronze, a method of synthesizing a publicly-known compound, such as a hydrothermal synthesis method, may be used.

The manufacturing method of electromagnetic wave absorbing particles according to the present embodiment may include any step other than the steps described above. As described above, it is favorable that electromagnetic wave absorbing particles according to the present embodiment are finely processed to become finer particles.

Specific means for making finer particles is not limited in particular, and various means that can mechanically crush a substance can be used. As a mechanical crushing method, a dry crushing method using a jet mill or the like may be used. Also, in the process of obtaining an electromagnetic wave absorbing particle dispersion liquid, which will be described later, mechanical crushing may be carried out in a solvent.

Also, as described above, the surfaces of electromagnetic wave absorbing particles according to the present embodiment can be modified with a compound containing one or more species of elements selected from among Si, Ti, Zr, and Al.

Therefore, a coating step may be provided in which, for example, an alkoxide containing one or more species of metals selected from among the group of metals described above may be added to form coating on the surfaces of electromagnetic wave absorbing particles according to the present embodiment.

[Electromagnetic Wave Absorbing Particle Dispersoid]

Next, an example of a configuration of an electromagnetic wave absorbing particle dispersoid will be described in the present embodiment.

An electromagnetic wave absorbing particle dispersoid according to the present embodiment contains at least electromagnetic wave absorbing particles and a thermoplastic resin.

Electromagnetic wave absorbing particles may be served as electromagnetic wave absorbing particles described above. Therefore, such electromagnetic wave absorbing particles can contain hexagonal tungsten bronze having oxygen deficiency. Then, such tungsten bronze is expressed by the general formula: $M_xWO_{3-y}$ (where one or more elements M include at least one or more species selected from among K, Rb, and Cs, $0.15 \leq x \leq 0.33$, and $0 < y \leq 0.46$), and the oxygen vacancy concentration $N_V$ in the electromagnetic wave absorbing particles can be set greater than or equal to $4.3 \times 10^{14}$ cm$^{-3}$ and less than or equal to $8.0 \times 10^{21}$ cm$^{-3}$.

Note that electromagnetic wave absorbing particles have already been described, and hence, the description will be omitted.

The type of thermoplastic resin in an electromagnetic wave absorbing particle dispersoid according to the present embodiment is not limited in particular. However, considering that an electromagnetic wave absorbing particle dispersoid according to the present embodiment is used in a variety of window materials, it is favorable to be a thermoplastic resin having sufficient transparency with respect to visible light.

Thereupon, it is favorable that the thermoplastic resin used for electromagnetic wave absorbing particles according to the present embodiment is one of one species of resin selected from among a group of resins including polyethylene terephthalate resin, polycarbonate resin, acrylic resin, styrene resin, polyamide resin, polyethylene resin, vinyl chloride resin, olefin resin, epoxy resin, polyimide resin, fluororesin, ethylene-vinyl acetate copolymer, and polyvinyl acetal resin; a mixture of two or more resins selected from among the group of resins; and a copolymer of two or more resins selected from among the group of resins.

Note that the type of thermoplastic resin can be selected in accordance with the application and the like, and a thermoplastic resin that is more suitable will be described in a manufacturing method of an electromagnetic wave absorbing particle dispersoid below.

Although the ratio of electromagnetic wave absorbing particles contained in an electromagnetic wave absorbing particle dispersoid according to the present embodiment is not limited in particular, it is favorable that an electromagnetic wave absorbing particle dispersoid according to the present embodiment contains electromagnetic wave absorbing particles by greater than or equal to 0.5 mass % and less than or equal to 80.0 mass %.

This is because the solar transmittance can be particularly controlled by setting the ratio of electromagnetic wave absorbing particles contained in an electromagnetic wave absorbing particle dispersoid according to the present embodiment to be greater than or equal to 0.5 mass %. However, an excessively high ratio of electromagnetic wave absorbing particles in an electromagnetic wave absorbing particle dispersoid may cause the electromagnetic wave absorbing particles to cohere, and due to increased scattering of visible light, may impair the transparency; therefore, it is favorable to be less than or equal to 80.0 mass % as described above.

An electromagnetic wave absorbing particle dispersoid according to the present embodiment can contain optional components other than the components described above. These points will be described in a manufacturing method electromagnetic wave absorbing particle dispersoid later.

Although the shape of an electromagnetic wave absorbing particle dispersoid according to the present embodiment is not limited in particular, it can be selected discretionarily in accordance with the application and the like, for example, a pellet shape may be adopted, for example, as will be described later. Also, an electromagnetic wave absorbing particle dispersoid according to the present embodiment can also have, for example, a sheet shape, a board shape, or a film shape.

[Manufacturing Method of Electromagnetic Wave Absorbing Particle Dispersoid]

In the present embodiment, an example of a configuration of a manufacturing method of an electromagnetic wave absorbing particle dispersoid will be described.

Here, the manufacturing method of an electromagnetic wave absorbing particle dispersoid will be described in the following order: (1) a manufacturing method of a masterbatch; and (2) a manufacturing method of an electromagnetic wave absorbing particle dispersoid in a sheet shape, a board shape, or a film shape (electromagnetic wave absorbing sheet, electromagnetic wave absorbing board, or electromagnetic wave absorbing film).

(1) Manufacturing Method of Masterbatch

A masterbatch is a pellet-shaped electromagnetic wave absorbing particle dispersoid containing electromagnetic wave absorbing particles, and can be manufactured from, for example, electromagnetic wave absorbing particles or electromagnetic wave absorbing particle dispersion powder, which will be described later, and resin.

Here, first, a manufacturing method of an electromagnetic wave absorbing particle dispersion powder will be described.

An electromagnetic wave absorbing particle dispersion powder is a substance having electromagnetic wave absorbing particles dispersed in a dispersant. An electromagnetic wave absorbing particle dispersion powder can be manufactured, for example, by the following steps.

First, by dispersing electromagnetic wave absorbing particles together with one or more species selected from among a dispersant, a coupling agent, and a surfactant into water or an organic solvent as a liquid medium, an electromagnetic wave absorbing particle dispersion liquid is obtained. Then, by removing the liquid medium from the electromagnetic wave absorbing particle dispersion liquid, an electromagnetic wave absorbing particle dispersion powder dispersed in the dispersant and the like can be obtained.

The method of dispersing electromagnetic wave absorbing particles in a liquid medium can be selected discretionarily as long as the particles are dispersed uniformly in the liquid medium. For example, a method of using a bead mill, ball mill, or sand mill; ultrasonic dispersion; or the like can be used.

As the organic solvent as the liquid medium, it is possible to make a selection from among a variety of solvents such as alcohol-based, ketone-based, hydrocarbon-based, and glycol-based solvents. Specifically, alcohol-based solvents such as isopropyl alcohol, methanol, ethanol, 1-propanol, isopropanol, butanol, pentanol, benzyl alcohol, diacetone alcohol, and 1-methoxy-2-propanol; ketone-based solvents such as dimethyl ketone, acetone, methyl ethyl ketone, methyl propyl ketone, methy isobutyl ketone, cyclohexanone, and isophorone; ester-based solvents such as 3-methyl-methoxy-propionate and butyl acetate; glycol derivatives such as ethylene glycol monomethyl ether, ethylene glycol monoethyl ether, ethylene glycol isopropyl ether, propylene glycol monomethyl ether, propylene glycol monoethyl ether, propylene glycol methyl ether acetate, and propylene glycol ethyl ether acetate; amides such as formamide, N-methylformamide, dimethylformamide, dimethylacetamide, and N-methyl-2-pyrrolidone; aromatic hydrocarbons such as toluene and xylene; halogenated hydrocarbons such as ethylene chloride and chlorobenzene; and the like may be listed.

However, among these, an organic solvent having a low polarity is favorable, and in particular, isopropyl alcohol, ethanol, 1-methoxy-2-propanol, dimethyl ketone, methyl ethyl ketone, methyl isobutyl ketone, toluene, propylene glycol monomethyl ether acetate, n-butyl acetate, and the like are more favorable. One or more of these organic solvents may be used singly or in combination.

Although the dispersant, coupling agent, and surfactant can be selected in accordance with the application, it is favorable that these agents have an amine-containing group; or a hydroxyl group, carboxyl group, or epoxy group, as a functional group. These functional groups are absorbed on the surfaces of electromagnetic wave absorbing particles to prevent the electromagnetic wave absorbing particles from cohering, to bring an effect of uniformly dispersing the electromagnetic wave absorbing particles in the electromagnetic wave absorbing particle dispersoid.

Dispersants, coupling agents, and surfactants that can be used favorably include, but are not limited to, phosphate ester compounds, polymer-based dispersants, silane-based coupling agents, titanate-based coupling agents, aluminum-based coupling agents, and the like. Examples of the polymeric dispersants include an acryl-based polymer dispersant, a urethane-based polymer dispersant, an acryl/block copolymer-based polymer dispersant, a polyether-based dispersant, a polyester-based polymer dispersant, and the like.

As commercial dispersants, Solsperse (registered trademark) 9000, 12000, 17000, 20000, 21000, 24000, 26000, 27000, 28000, 32000, 35100, 54000, 250 (manufactured by Japan Lubrizol Co., Ltd.); Efka (registered trademark) 4008, 4009, 4010, 4015, 4046, 4047, 4060, 4080, 7462, 4020, 4050, 4055, 4400, 4401, 4402, 4403, 4300, 4320, 4330, 4340, 6220, 6225, 6700, 6780, 6782, 8503 (manufactured by Efka additives); Ajisper (registered trademark) PA111, PB821, PB822, PN411, Faymex L-12 (manufactured by Ajinomoto Fine-Techno Co., Inc.); DisperBYK (registered trademark) 101, 102, 106, 108, 111, 116, 130, 140, 142, 145, 161, 162, 163, 164, 166, 167, 168, 170, 171, 174, 180, 182, 192, 193, 2000, 2001, 2020, 2025, 2050, 2070, 2155, 2164, 220S, 300, 306, 320, 322, 325, 330, 340, 350, 377, 378, 380N, 410, 425, 430 (manufactured by BYK Japan KK); Disparlon (registered trademark) 1751N, 1831, 1850, 1860, 1934, DA-400N, DA-703-50, DA-725, DA-705, DA-7301, DN-900, NS-5210, $N_pI$-8514L (manufactured by Kusumoto Chemicals, Ltd.); Arufon (registered trademark) UC-3000, UF-5022, UG-4010, UG-4035, and UG-4070 (manufactured by Toagosei Co., Ltd.); and the like may be listed.

Further, it is favorable that the concentration of electromagnetic wave absorbing particles with respect to the liquid medium in the electromagnetic wave absorbing particle dispersion liquid is set to be greater than or equal to 1 mass % and less than or equal to 50 mass %. By setting the concentration of electromagnetic wave absorbing particles with respect to the liquid medium to be greater than or equal to 1 mass %, it is possible to prevent the amount of liquid medium to be removed from being excessively great, and to control the manufacturing cost. On the other hand, by setting the concentration of the electromagnetic wave absorbing particles with respect to the liquid medium to be less than or equal to 50 mass %, it is possible to control cohesion of the electromagnetic wave absorbing particles and to increase the uniformity of dispersion into the liquid medium. Also, it is possible to control the viscosity of the electromagnetic wave absorbing particle dispersion liquid and to improve the easiness of handling.

The method of dispersing electromagnetic wave absorbing particles in a liquid medium is not limited in particular, as long as that the method can disperse the electromagnetic wave absorbing particles in the liquid medium. At this time, it is favorable to carry out the dispersion so that the mean particle diameter of the electromagnetic wave absorbing particles becomes less than or equal to 100 nm, and it is more favorable that the mean particle diameter becomes greater than or equal to 0.1 nm and less than or equal to 100 nm.

As the method of dispersing electromagnetic wave absorbing particles in a liquid medium, methods of dispersion using devices such as a bead mill, a ball mill, a sand mill, a paint shaker, an ultrasonic homogenizer, and the like may be listed. Among these, it is favorable to crush and disperse electromagnetic wave absorbing particles with a medium-stirring mill such as a bead mill, a ball mill, a sand mill, and a paint shaker that use media (beads, balls, Ottawa sand), from the viewpoint of shorting the time required to obtain the desired mean particle diameter. By crushing and dispersing electromagnetic wave absorbing particles with a medium-stirring mill, the electromagnetic wave absorbing particles are dispersed in the liquid medium, and at the same time, becomes finer particles caused by collision between the electromagnetic wave absorbing particles and collision between the medium and the electromagnetic wave absorbing particles, and thereby, the electromagnetic wave absorbing particles can be made finer to be dispersed (i.e., crushed and dispersed).

It is favorable that the mean particle diameter of electromagnetic wave absorbing particles is greater than or equal to 0.1 nm and less than or equal to 100 nm as described above. This is because a smaller mean particle diameter decreases scattering of light in the visible light region of wavelengths from 400 nm to 780 nm due to geometric scattering or Mie scattering; and as a result, it is possible to avoid the loss of clear transparency, which would be caused by an electromagnetic wave absorbing particle dispersoid like a cloudy glass, in which electromagnetic wave absorbing particles are dispersed in a resin. In other words, when the mean particle diameter becomes less than or equal to 200 nm, the geometric scattering or Mie scattering described above decreases, and the scattering can be considered in a Rayleigh scattering region. In a Rayleigh scattering region, the scattered light is proportional to the sixth power of the dispersed particle diameter; therefore, as the dispersion particle diameter decreases, the scattering decreases and the transparency improves. Further, when the mean particle diameter becomes less than or equal to 100 nm, the scattered light becomes extremely insignificant, which is favorable.

Meanwhile, as for the dispersion state of electromagnetic wave absorbing particles in an electromagnetic wave absorbing particle dispersoid in which the electromagnetic wave absorbing particles are dispersed in a resin and the like, which is obtained by using an electromagnetic wave absorbing particle dispersion liquid, as long as the dispersion liquid is added to the resin and the like by a publicly-known method, cohesion does not occur to be greater than the mean particle diameter of the electromagnetic wave absorbing particles in the dispersion liquid.

Also, as long as the mean particle diameter of electromagnetic wave absorbing particles is greater than or equal to 0.1 nm and less than or equal to 100 nm, it is possible to prevent the electromagnetic wave absorbing particle dispersoid to be manufactured and its molded products (plates, sheets, etc.) from becoming grayish products having monotonically decreased transmittance.

A dispersion powder can be obtained by removing the liquid medium from an electromagnetic wave absorbing particle dispersion liquid. Although the method of removing the liquid medium from an electromagnetic wave absorbing particle dispersion liquid is not limited in particular, it is favorable to dry the electromagnetic wave absorbing particle dispersion liquid under reduced pressure. Specifically, the electromagnetic wave absorbing particle dispersion liquid is dried under reduced pressure while stirring, to separate the composition containing the electromagnetic wave absorbing particles from the liquid medium component. As a device used for drying under reduced pressure, a vacuum stirring type dryer may be listed; however, any device may be used as long as having the function described above, and is not limited in particular. Also, the pressure value of the reduced pressure for drying is not limited in particular and can be selected appropriately.

By using such a method of drying under reduced pressure, it is possible to improve the removal efficiency of the liquid medium from the electromagnetic wave absorbing particle dispersion liquid, and to prevent the electromagnetic wave absorbing particle dispersion powder from being exposed to a high temperature for a long period of time; therefore, the electromagnetic wave absorbing particles dispersed in the electromagnetic wave absorbing particle dispersion powder do not cohere, which is favorable. Furthermore, the productivity of the electromagnetic wave absorbing particle dispersion powder is increased, and it is easy to collect the evaporated liquid medium, which is favorable from the viewpoint of environmental considerations.

However, the method of removing the liquid medium from the electromagnetic wave absorbing particle dispersion liquid is not limited to the method described above; for example, a spray-drying method or the like may be used.

In the electromagnetic wave absorbing particle dispersion powder obtained after the step of removing the liquid medium, it is favorable that the residual liquid medium accounts for less than or equal to 5 mass %. This is because as long as the residual liquid medium accounts for less than or equal to 5 mass %, air bubbles are not generated when the electromagnetic wave absorbing particle dispersion powder is processed into an electromagnetic wave absorbing particle dispersoid or an electromagnetic wave absorbing laminated transparent base material, and good appearance and optical properties are maintained.

Then, the obtained electromagnetic wave absorbing particle dispersion powder is dispersed in a resin and the resin is pelletized to obtain a masterbatch. Although the resin is not limited in particular, for example, a thermoplastic may be used.

Also, after uniformly mixing the obtained electromagnetic wave absorbing particle dispersion powder with particulates or pellets of a thermoplastic resin and other additives as necessary, by kneading with a vent-type single-screw or twin-screw extruder, and cutting the melt extruded strands into pellets by a general cutting method, a masterbatch can be obtained. In this case, the shape may be cylindrical or square-shaped. Also, it is also possible to adopt a so-called hot cut method of directly cutting the melt extrudate. In this case, the shape becomes a spherical shape in general.

Note that although an example has been described here in which a masterbatch is produced from an electromagnetic wave absorbing particle dispersion powder prepared in advance, it is not limited as such; for example, instead of the electromagnetic wave absorbing particle dispersion powder, electromagnetic wave absorbing particles can be used directly.

(2) Method of Manufacturing an Electromagnetic Wave Absorbing Particle Dispersoid Having a Sheet Shape, a Board Shape, or a Film Shape By uniformly mixing an electromagnetic wave absorbing particle dispersion powder or a masterbatch into a transparent resin, an electromagnetic wave absorbing particle dispersoid having a sheet shape, a board shape, or a film shape can be manufactured.

In the case of manufacturing an electromagnetic wave absorbing sheet, an electromagnetic wave absorbing board, or an electromagnetic wave absorbing film as an electromagnetic wave absorbing particle dispersoid according to the present embodiment, a variety of thermoplastic resins can be used as the resin constituting the sheet, board, or film. However, considering that an electromagnetic wave absorbing sheet, an electromagnetic wave absorbing board, or an electromagnetic wave absorbing film as an electromagnetic wave absorbing particle dispersoid according to the present embodiment is used in a variety of window materials, it is favorable to be a thermoplastic resin having sufficient transparency with respect to visible light.

Thereupon, as a resin to be used for an electromagnetic wave absorbing particle dispersoid according to the present embodiment, for example, it is favorable to select a resin from among one type of resin selected from among a group of resins including polyethylene terephthalate resin, polycarbonate resin, acrylic resin, styrene resin, polyamide resin, polyethylene resin, vinyl chloride resin, olefin resin, epoxy resin, polyimide resin, fluororesin, and ethylene-vinyl acetate copolymer; a mixture of two or more resins selected from among the group of resins; and a copolymer of two or more resins selected from among the group of resins.

Note that in the case of producing a masterbatch described above, it is favorable to use, for example, the thermoplastic resins described above.

Also, in the case of using an electromagnetic wave absorbing particle dispersoid according to the present embodiment as a window material as it is, in consideration of high transparency and general characteristics required for a window material such as the rigidity, lightness, long-term durability, and cost, as the thermoplastic resin to be used, it is favorable to use one or more species selected from among polyethylene terephthalate resin, polycarbonate resin, and acrylic resin. In particular, it is further favorable that the thermoplastic resin is a polycarbonate resin.

Meanwhile, in the case of using an electromagnetic wave absorbing particle dispersoid according to the present embodiment as an intermediate layer of an electromagnetic wave absorbing laminated transparent base material, which will be described later, from the viewpoint of adhesion to a transparent base material, weather resistance, and penetration resistance, as the thermoplastic resin, it is favorable to use polyvinyl acetal resin or ethylene-vinyl acetate copolymer, and further favorable to use polyvinyl butyral resin.

Also, in the case of using an electromagnetic wave absorbing particle dispersoid as an intermediate layer as described above, and in the case where the thermoplastic resin to be contained by itself does not have sufficient flexibility or adhesion a transparent base material, for example, in the case where the thermoplastic resin is a polyvinyl acetal resin, it is favorable to further add a plasticizer.

As the plasticizer, a substance that is used as a plasticizer for a thermoplastic resin can be used. For example, in the case of using polyvinyl acetal as the thermoplastic, as the plasticizer, one or more of species selected from among a plasticizer being a compound of a monohydric alcohol and an organic acid ester; an ester-based plasticizer such as a polyhydric alcohol organic acid ester compound; a phosphate-based plasticizer such as an organophosphate-based plasticizer; and the like may be listed. It is favorable that all of these plasticizers are liquid at room temperature. Among these, a plasticizer of an ester compound synthesized from a polyhydric alcohol and a fatty acid is favorable.

After mixing an electromagnetic wave absorbing particle plasticizer dispersion liquid, an electromagnetic wave absorbing particle dispersion powder, or a masterbatch with a thermoplastic resin and a plasticizer and other additives if desired, by a publicly-known method such as extrusion molding or injection molding, by molding the mixture into, for example, a planar or curved plate, an electromagnetic wave absorbing particle dispersoid can be manufactured.

For the method of forming an electromagnetic wave absorbing particle dispersoid, a publicly-known method may be used. For example, methods of calendar-rolling, extrusion, casting, inflation, and the like can be used.

Although the shape of an electromagnetic wave absorbing particle dispersoid according to the present embodiment can be selected in accordance with the application, it is favorable to have, for example, a sheet shape, a board shape, or a film shape.

Also, although the ratio of electromagnetic wave absorbing particles contained in an electromagnetic wave absorbing particle dispersoid according to the present embodiment is not limited in particular, it is favorable to be greater than or equal to 0.5% and less than or equal to 80.0 mass % as described above. Therefore, when kneading with a thermoplastic resin, it is favorable to select the mixing ratio to obtain the desired content.

[Electromagnetic Wave Absorbing Laminated Transparent Base Material]

In the present embodiment, an example of a configuration of an electromagnetic wave absorbing laminated transparent base material will be described.

An electromagnetic wave absorbing laminated transparent base material according to the present embodiment includes multiple sheets of transparent base materials and an electromagnetic wave absorbing particle dispersoid described above, and the electromagnetic wave absorbing particle dispersoid can be arranged between the multiple sheets of transparent base materials.

An electromagnetic wave absorbing laminated transparent base material according to the present embodiment can have a configuration in which an electromagnetic wave absorbing particle dispersoid described above is arranged as intermediate layers between the multiple sheets of transparent base materials.

An electromagnetic wave absorbing laminated transparent base material is a material that includes an electromagnetic wave absorbing particle dispersoid as an intermediate layer sandwiched by transparent base materials from both sides as described above.

The transparent base material is not limited in particular; a flat glass, sheet-shaped plastic, or film-shaped plastic may be suitably used, which are transparent in the visible light region.

In the case of using plastic as a transparent base material, the material of the plastic is not limited in particular and can be selected in accordance with the application; for example, in the case of using in transportation equipment such as automobiles, from the viewpoint of ensuring the transparency for a driver or passenger of the transportation equipment, a transparent resin such as a polycarbonate resin, an acrylic resin, or a polyethylene terephthalate resin is favorable; also, one or more species selected from among a polyamide resin, a vinyl chloride resin, an olefin resin, an epoxy resin, a polyimide resin, a fluororesin, and the like may be suitably used.

Note that multiple sheets of transparent base materials in an electromagnetic wave absorbing laminated transparent base material according to the present embodiment do not need to be constituted with the same material; for example, part of the transparent base materials may be made of glass and the rest of the transparent base materials may be made of plastic.

Also, an electromagnetic wave absorbing laminated transparent base material according to the present embodiment can have multiple sheets of transparent base materials as described above, and the number of sheets is not limited in particular. Therefore, an electromagnetic wave absorbing laminated transparent base material according to the present embodiment may have, for example, three or more sheets of transparent base materials and two or more layers of transparent base materials. In this way, in the case where multiple layers are present between multiple sheets of transparent base materials, an electromagnetic wave absorbing particle dispersoid may be placed between every pair of the transparent base materials; however, it is possible to place a member having another function or the like between part of the multiple transparent base materials. For example, a member that absorbs ultraviolet rays or the like may be placed.

An electromagnetic wave absorbing laminated transparent base material according to the present embodiment can also be obtained by a publicly-known method that bonds and integrates multiple sheets of transparent base materials facing each other between which an electromagnetic wave absorbing particle dispersoid is sandwiched to be present as described above. The obtained electromagnetic wave absorbing laminated transparent base material can be used primarily as a front part of an automobile or a window of a building. Note that in the case of using it as a front part of an automobile or the like as described above, it is favorable to use an inorganic glass as the transparent base material.

EXAMPLES

In the following, the present invention will be described specifically with reference to examples. However, the present invention is not limited to the following examples.

Evaluation methods in the following examples will be described.

(Chemical Analysis)

Chemical analysis of obtained electromagnetic wave absorbing particles was carried out by atomic absorption spectroscopy (AAS) for Cs and ICP optical emission spectrometry (ICP-OES) for W. Also, for O, a light element analyzer (model: ON-836, manufactured by LECO) was used to melt a sample in He gas, and CO gas reacted with carbon in a crucible was analyzed by a method of determining the amount by IR absorption spectroscopy. The chemical analysis was carried out three times for each component to calculate the standard deviation.

(X-Ray Diffraction Measurement)

X-ray diffraction measurement was carried out by powder XRD measurement using Cu—K-$\alpha$ rays with a device called X'Pert-PRO/MPD manufactured by Spectris Co., Ltd.

The measurement was carried out for a range of angle $2\theta$ greater than or equal to 10° and less than or equal to 100, with a scan speed at 0.095° ($2\theta$)/sec, and measurement points being 5555 points/90°. The diffraction angle was calibrated with an Si standard sample (NIST640e) to carry out a Rietveld analysis assuming the space group $P6_3/mcm$ or $P6_3\,cm$, so as to determine the lattice constants and atomic positions of a crystal phase.

Also, in Examples 1 to 10, the interatomic distances were calculated based on the obtained atomic positions of the crystal phase; among the W—O distances in a $WO_6$ octahedron, the ratio of the maximum value to the minimum value of distances from [an O atom present in the c-axis direction when viewed from the W atom] to [the W atom at the center] (the maximum value/the minimum value) was determined.

(Visible Light Transmittance, Solar Transmittance, and Near-Infrared Transmittance at the Wavelength of 850 nm)

The visible light transmittance, solar transmittance, and near-infrared transmittance at the wavelength of 850 nm of an electromagnetic wave absorbing particle dispersoid and an electromagnetic wave absorbing laminated transparent base material were measured according to ISO 9050 and JIS R 3106. Specifically, the transmittance was measured by using a spectrophotometer U-4100 manufactured by Hitachi, Ltd. and calculated by multiplying by a coefficient corresponding to the spectrum of solar light. The transmittance was measured at 5 nm intervals in a range of wavelengths greater than or equal to 300 nm and less than or equal to 2100 nm. Measurement steps will be described in detail later in Example 1.

(Mean Particle Diameter)

The mean particle diameter was determined from a particle size distribution measured by using a transmission electron microscope (TECNAI G2 F20 manufactured by FEI Company).

Specifically, the particle diameter was measured for 300 particles from an observed image of the transmission electron microscope, and the particle diameter at the cumulative value of 50% in the particle size distribution was determined as the mean particle diameter.

Example 1

As the raw materials, an aqueous solution of cesium carbonate ($Cs_2CO_3$) and tungstic acid ($H_2WO_4$) were weighed, mixed, and kneaded to prepare a raw material mixture to be a ratio of Cs/W=0.33.

Then, the raw material mixture was dried in the atmosphere at 100° C. for 12 hours.

Then, 10 g of the dried raw material mixture (precursor) was spread flat and thinly over a carbon combustion boat, heated and held (heating step) at 550° C. for 2 hours under a gas stream of 1 vol % $H_2$ gas with $N_2$ gas as a carrier (hereafter, also referred to as "1 vol % $H_2$—$N_2$").

Next, after held at 550° C. for 1 hour under a 100 vol % $N_2$ gas stream, the temperature was raised to 800° C. and held at 800° C. for 1 hour to be homogenized (homogenization step).

After the homogenization step, a blue powder of electromagnetic wave absorbing particles was obtained.

The obtained blue powder was chemically analyzed independently for elements Cs, W, and O. As a result, values of 15.62±0.15 mass % for Cs, 66.54±0.20 mass % for W, and 14.72±0.26 mass % for O were obtained. The values correspond to 97.4% of the prepared amount for Cs, 99.9% of the prepared amount for W, and 84.7% of the prepared amount of O. These were normalized to 100%, converted to at %, and the atomic number ratio was obtained with W=1, to determine the composition of the obtained compound as $Cs_{0.325}WO_{2.542}$.

In the general formula $M_xWO_{3-y}$ of tungsten bronze described above, x=0.325, y=0.458, and O was found to be deficient by 15.3%.

As a result of XRD measurement with respect to the obtained blue powder, the powder matched JCPDS card No. 81-1224 and was identified as $Cs_{0.3}WO_3$.

In order to further obtain detailed information on the structure, the Rietveld analysis was carried out with the XRD patterns based on the space group $P6_3/mcm$. Here, the site occupancy rate was 100% for W, 97% for Cs, and 50% as maximum for O(1), and the Wyckoff coordinates for the elements were set as 6g site (x, 0, 0.25) for W, 12k site (x, 0, z); z=0 for O(1), 12j site (x, y, 0.25) for O(2), and 2b site (0, 0, 0) for Cs. The isotropic temperature factor B (×10$^4$ pm$^2$) was assumed to be 0.2047 for W, 0.07 for O(1), 0.10 for O(2), and 1.035 for Cs. At this time, as a reliability factor Rf defined by the following formula, a value of Rf=0.021 was obtained, which is the smallest value of cesium tungsten bronze compared with values in the past literature.

$$R_f = \frac{\sum_k |\sqrt{I_k(obs)} - \sqrt{I_k(calc)}|}{\sum_k \sqrt{I_k(obs)}}$$ [Formula 1]

Therefore, the analysis results in the present example are considered to be the most reliable analysis to date. By this analysis, the lattice constants were obtained as a=7.40686(4)(Å) and c=7.61015(6) (Å) (the standard deviation of the last digit is in parentheses).

These values of lattice constants are positioned very close to the straight line defined by the above-described expression c=−3.436a+33.062 for the lattice constants a and c in the case of the element M being Cs. It was also confirmed that these were positioned in the vicinity of the point 216 in FIG. 2.

From the calculated lattice constants, the volume of a unit cell of tungsten bronze contained in electromagnetic wave absorbing particles produced in the present example was determined as 361.6 Å$^3$; therefore, based on the molar ratio of oxygen obtained from the chemical analysis, the oxygen vacancy concentration $N_V$ was found to be $N_V$=7.60×10$^{21}$ cm$^{-3}$.

Then, the W—O distance in the $WO_6$ octahedron was determined from the lattice constants and atomic coordinates of the crystal phase obtained by the Rietveld analysis. As a result, there are two distances from [an O atom present in the c-axis direction when viewed from the W atom] to [the W atom at the center], which were 1.903 Å and 1.920 Å, respectively, and the ratio of the maximum value to the minimum value was 1.01.

Next, 20 mass % of the powder, 10 mass % of an acryl-based polymeric dispersant having an amine-containing group as a functional group, and 70 mass % of methyl isobutyl ketone (MIBK) as an organic solvent were weighed (hereafter, referred to as the "dispersant a"). These were loaded into a paint shaker containing 0.3 mm φZrO$_2$ beads and crushed and dispersed for 10 hours to obtain an electromagnetic wave absorbing particle dispersion liquid (hereafter, referred to as the "dispersion liquid A"). Here, the mean particle diameter of electromagnetic wave absorbing particles in the dispersion liquid A was measured, and was 22.1 nm.

The dispersion liquid A was further added with the dispersant a, and prepared so as to have the mass ratio of the dispersant a and the electromagnetic wave absorbing particles being [dispersant a/electromagnetic wave absorbing particles]=3. Next, methyl isobutyl ketone was removed from the dispersion liquid A by using a spray dryer, to obtain an electromagnetic wave absorbing particle dispersion powder.

Into a polycarbonate resin as a thermoplastic resin, a predetermined amount of the electromagnetic wave absorbing particle dispersion powder was added so that a maximum transmittance of 89.7% in the visible light region is obtained for an electromagnetic wave absorption sheet (2.0 mm thick) as an electromagnetic wave absorbing particle dispersoid having a sheet shape to be produced (all maximum values were taken at around 500 nm), to prepare a composition for manufacturing electromagnetic wave absorbing sheets.

This composition for manufacturing electromagnetic wave absorbing sheets was kneaded at 280° C. by using a twin-screw extruder, extruded from a T-die, and formed into a sheet material of 2.0 mm thick by a calendar-rolling method, to obtain an electromagnetic wave absorbing sheet according to Example 1.

The spectral transmittance of this electromagnetic wave absorbing sheet was measured. From the transmittance profiles, the visible light transmittance (VLT), the solar transmittance (ST), and the near-infrared transmittance at the wavelength of 850 nm ($T_{850}$) were calculated or read. $T_{850}$ is a representative transmittance in near-infrared wavelengths, having a high sensor sensitivity. VLT=84.89%, ST=65.08%, and $T_{850}$=57.43% were obtained. It can be seen that while the visible transmittance is very high, the solar transmittance is kept low, and hence, the near-infrared shielding effect is very high. Also, in this sample, as described above, the transmittance of 57.43% at the sensor wavelength of 850 nm was obtained.

The evaluation results are summarized in Table 1 and Table 2.

Examples 2 to 7

Powders of electromagnetic wave absorbing particles were produced in substantially the same way as in Example 1 except that the hold time at 550° C. in the heating step was changed to times shown in Table 1, and next, in substantially the same way as in Example 1, the chemical analysis, measurement by XRD patterns, and Rietveld analysis using the XRD patterns were carried out for these powders.

Furthermore, electromagnetic wave absorbing particle dispersion liquids were prepared in substantially the same way as in Example 1 except that the electromagnetic wave absorbing particles obtained in the respective Examples were used, to evaluate the mean particle diameter. Then, in substantially the same way as in Example 1, electromagnetic wave absorbing particle dispersion powders were produced. Then, in substantially the same way as in Example 1, electromagnetic wave absorbing sheets were produced to evaluate spectrophotometric properties. These results are summarized in Tables 1 and 2.

As shown in Table 1, in Examples 2 to 7, the hold times in the heating step at 550° C. were set increasingly as 45 minutes, 50 minutes, 60 minutes, 75 minutes, 3 hours, and 6 hours, respectively. Generally, in this order, the lattice constant decreases in the a-axis and increases in the c-axis. In other words, in the case of the straight line illustrated in FIG. 2, it moved toward the upper left side. This is a change in a direction in which the Jahn-Teller distortion is gradually alleviated. In addition, in the case of the hold time being 2 hours or longer, the position was almost unchanged, indicating that the alleviation has reached an equilibrium state. The oxygen vacancy concentration $N_V$ also increased gradually up to the hold time of 75 minutes, but remained around the same value for the hold time of 2 hours or longer.

Next, as a result of the spectral characteristic evaluation of the electromagnetic absorption sheets, as shown in Tables 1 and 2, a tendency was observed that while the oxygen vacancy concentration increases, the ST/VLT ratio decreases. This indicates that the shielding effect of near-infrared light relative to the visible light transmittance becomes stronger while the oxygen vacancy concentration increased.

At the same time, while the oxygen vacancy concentration increases, $T_{850}$ decreases gradually and the sensor transmittance decreases gradually; however, $T_{850}$ decreases by a smaller extent than ST/VLT. Therefore, for example, the amount of electromagnetic wave absorbing particles required to achieve the target solar transmittance can be decreased, and the sensor transmittance, namely, the near-infrared transmittance at the wavelength of 850 nm can be made higher.

Examples 8 to 10

When preparing a raw material mixture, in Examples 8 to 10, the raw materials were weighed, mixed, and kneaded so that Cs/W=0.30, 0.25, and 0.20, respectively. Also, in the heating step, heating was carried out under a stream of 0.7 vol % $H_2$ gas with $N_2$ gas as the carrier. Except for the above points, electromagnetic wave absorbing particles were prepared and evaluated in substantially the same way as in Example 4.

Furthermore, electromagnetic wave absorbing particle dispersion liquids were prepared in substantially the same way as in Example 1 except that the electromagnetic wave absorbing particles obtained in the respective Examples were used, to evaluate the mean particle diameter. Then, in substantially the same way as in Example 1, electromagnetic wave absorbing particle dispersion powders were produced. Then, in substantially the same way as in Example 1, electromagnetic wave absorbing sheets were produced to evaluate spectrophotometric properties. These results are summarized in Tables 1 and 2.

According to the results shown in Tables 1 and 2, it can be seen that the lattice constants are changed such that while the value of Cs/W, namely, x decreases, the lattice constant in the a-axis direction increases, and the lattice constant in the c-axis direction decreases. The extent of this change was far greater than in the case of changing the amount y of oxygen deficiency in Examples 1 to 7. More specifically, [the amount of change in the lattice constants from Example 10 (x=0.196) to Example 3 (x=0.327)] was approximately 4.6 times greater than [the amount of change in the lattice constants from Example 2 (y=0.260) to Example 1 (y=0.458)]. In other words, it was confirmed that the added amount x of the element(s) M has a large effect on the change in the lattice constants.

In Example 10, although the amount of x as Cs/W was measured to be 0.196, a small amount of diffraction rays of $WO_3$, $WO_{2.90}$, and $WO_{2.93}$ as different phases were mixed in the powder XRD diffraction patterns at this time.

Also, as for the electromagnetic wave absorbing sheets, as shown in Tables 1 and 2, a tendency was observed that while the value of Cs/W, namely, x, increases, the ST/VLT ratio decreases. This indicates that the shielding effect of near-infrared light relative to the visible light transmittance becomes stronger while the value of Cs/W increases.

At the same time, it was confirmed that while Cs/W increases, $T_{850}$ decreases gradually and the sensor transmittance decreased gradually. This is because the increase in Cs/W increases free electrons, increases the surface plasmon absorption, and the increase in the surface plasmon absorption reaches up to the wavelength of 850 nm.

However, it was confirmed that the sensor transmittance was 53.01% even in Example 8 as the lowest, which is not problematic in practice.

Example 11

A total of 30 g of anhydrous tungsten trioxide ($WO_3$), cesium tungstate ($Cs_2WO_4$), and a (metal) powder of W simple substance were weighed and mixed so that the atomic ratios became Cs/W=0.33 and O/W=3.00.

At the time of weighing, $Cs_2WO_4$ took in the atmospheric moisture and stained the drug packaging paper, but was weighed as quickly as possible to be put into a 10-mm-diameter quartz tube and vacuum sealed, and then, heated and held at 750° C. for 3 days (heating and reduction step).

The XRD measurement was carried out with respect to the obtained electromagnetic wave absorbing particles, and as a result of determining the lattice constants, a=7.4058 Å and c=7.6102 Å; values close to those of the electromagnetic wave absorbing particles in Example 1 were obtained. In other words, electromagnetic wave absorbing particles having an amount of oxygen deficiency close to the maximum were obtained.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Tables 1 and 2.

Note that the transmittance of the electromagnetic wave absorbing sheet was 85.03%, the solar radiation was 65.69%, and the near-infrared transmittance at the wavelength of 850 nm was 57.16%; values close to those in Example 1 were obtained.

Example 12

A total of 30 g of anhydrous tungsten trioxide ($WO_3$), cesium tungstate ($Cs_2WO_4$), and a (metal) powder of W simple substance were weighed and mixed so that the atomic ratios became Cs/W=0.33 and O/W=2.95. At the time of weighing, $Cs_2WO_4$ took in the atmospheric moisture and stained the drug packaging paper, but was weighed and mixed as quickly as possible, spread thinly over a carbon combustion boat, put into a vacuum calcination furnace, and then, heated and held at 750° C. for 3 days (heating and reduction step).

The XRD measurement was carried out with respect to the obtained electromagnetic wave absorbing particles, and as a result of determining the lattice constants, a=7.4066 Å and c=7.6113 Å; values close to those of the electromagnetic wave absorbing particles in Example 1 were obtained. In other words, electromagnetic wave absorbing particles having an amount of oxygen deficiency close to the maximum were obtained.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Tables 1 and 2.

Note that the transmittance of the electromagnetic wave absorbing sheet was 85.00%, the solar radiation was 65.30%, and the near-infrared transmittance at the wavelength of 850 nm was 57.10%; values close to those in Example 1 were obtained.

Example 13

A total of 30 g of anhydrous tungsten trioxide ($WO_3$), cesium tungstate ($Cs_2WO_4$), and a (metal) powder of W simple substance were weighed and mixed so that the atomic ratios became Cs/W=0.33 and O/W=3.00.

Note that the raw material $Cs_2WO_4$ was held in advance in the calcination furnace at 200° C. for 1 hour to remove the moisture, and was weighed as quickly as possible.

Then, the raw material mixture was spread flat and thinly over an alumina combustion boat, placed in a vacuum calcination furnace, and heated and held at 750° C. for 3 days (heating and reduction step).

The XRD measurement was carried out with respect to the obtained electromagnetic wave absorbing particles, and as a result of determining the lattice constants, a=7.4078 Å and c=7.6086 Å; values close to those of the electromagnetic wave absorbing particles in Example 5 were obtained. In other words, compared to Example 1 and the like, with respect to the extent of reduction, electromagnetic wave absorbing particles in a slightly alleviated state of reduction were obtained.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Tables 1 and 2.

Note that the transmittance of the electromagnetic wave absorbing sheet was 85.53% and the solar radiation was 66.33%; values close to those in Example 5 were obtained. However, although the near-infrared shielding became stronger than in Example 5 as ST/VLT=0.776, the near-infrared transmittance at the wavelength of 850 nm was 60.97%; it was confirmed that there was almost no difference from Example 5. In other words, if compared for the same near-infrared shielding effect, the sensor transmittance is slightly improved compared to Example 5.

Example 14

A total of 30 g of anhydrous tungsten trioxide ($WO_3$), cesium tungstate ($Cs_2WO_4$), and a (metal) powder of W simple substance were weighed and mixed so that the atomic ratios became Cs/W=0.33 and O/W=3.00.

Note that the raw material $Cs_2WO_4$ was held in advance in a calcination furnace at 200° C. for 1 hour to remove the moisture, carefully introduced into a dried glove box to be weighed and mixed with the other raw materials.

Then, the raw material mixture was spread flat and thinly over an alumina combustion boat, placed in a vacuum calcination furnace, and heated and held at 750° C. for 2 days (heating and reduction step).

The XRD measurement was carried out with respect to the obtained electromagnetic wave absorbing particles, and as a result of determining the lattice constants, a=7.4106 Å and c=7.5978 Å, which are values close to the point 212 among the points illustrated in FIG. 2. In other words, a sample having a low amount y of oxygen deficiency was obtained.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Tables 1 and 2.

Note that the transmittance of the electromagnetic wave absorbing sheet was 85.42% and the solar radiation was 67.87%. Also, ST/VLT=0.795, slightly larger than in Example 3. However, the near-infrared transmittance at the wavelength of 850 nm was 73.32%; it was confirmed to be even higher than in Example 3. Therefore, it was confirmed that electromagnetic wave absorbing particles were obtained that are particularly effective when it is desired to increase the sensor transmission.

Example 15

A total of 30 g of anhydrous tungsten trioxide ($WO_3$), cesium tungstate ($Cs_2WO_4$), and a (metal) powder of W simple substance were weighed and mixed so that the atomic ratios became Cs/W=0.33 and O/W=3.00.

Note that the raw material $Cs_2WO_4$ was held in advance in a calcination furnace at 200° C. for 1 hour to remove the moisture, carefully introduced into a dried glove box to be weighed and mixed with the other raw materials.

Then, the raw material mixture was spread flat and thinly over an alumina combustion boat, placed in a calcination furnace, and heated and held at 750° C. for 2 days under a gas stream of 100% nitrogen gas (heating and reduction step).

The XRD measurement was carried out with respect to the obtained electromagnetic wave absorbing particles, and as a result of determining the lattice constants, a=7.4091 Å and c=7.5998 Å, which are values close to the point 213 among the points illustrated in FIG. 2. In other words, a sample with a relatively small amount y of oxygen deficiency was obtained.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Tables 1 and 2.

Note that the transmittance of the electromagnetic wave absorbing sheet was 85.61% and the solar radiation was 70.19%. Also, the near-infrared transmittance at the wavelength of 850 nm was 68.93%; it was confirmed to be even higher than in Example 2.

Example 16

Blue electromagnetic wave absorbing particles $Cs_{0.325}WO_{2.542}$ in a fully-reduced state produced in Example 1 were placed in an alumina combustion boat, and annealed at 500° C. for 30 minutes in the atmosphere as an oxidizing gas atmosphere (annealing step).

The obtained electromagnetic wave absorbing particles after the annealing step were fairly whitish.

The XRD measurement was carried out with respect to the obtained electromagnetic wave absorbing particles, and as a result of determining the lattice constants, a=7.4135 Å and c=7.5886 Å; it was confirmed that the line illustrated in FIG. 2 was moved toward the lower right side. Note that annealing was carried out in the atmosphere; therefore, it can be considered that oxygen became excessive and the lattice constants changed greatly.

Furthermore, the electromagnetic wave absorbing particles after the annealing step were placed in a tubular furnace at 500° C., through which 1 vol % $H_2$—$N_2$ gas was flowed, held for 30 minutes, and then, taken out (the annealing step).

Then, the obtained electromagnetic wave absorbing particles were found to be slightly bluish in color.

The XRD measurement was carried out with respect to the obtained electromagnetic wave absorbing particles, and as a result of determining the lattice constants, a=7.4110 Å and c=7.5962 Å; it was confirmed to be positioned between the points 211 and 212 of the line illustrated in FIG. 2. In other words, it was confirmed that the amount of oxygen deficiency became smaller.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Tables 1 and 2.

Note that the transmittance of the electromagnetic wave absorbing sheet was 85.85% and the solar radiation was 72.72%. Also, ST/VLT=0.847, which is substantially the same as in Example 15. However, the near-infrared transmittance at the wavelength of 850 nm was 72.60%; it was confirmed to be even higher than in Example 15. Therefore, it was confirmed that electromagnetic wave absorbing particles were obtained that are particularly effective when it is desired to increase the sensor transmission.

Example 17

As the raw materials, an aqueous solution of rubidium carbonate ($Rb_2CO_3$) and tungstic acid ($H_2WO_4$) were weighed, mixed, and kneaded to prepare a raw material mixture to be a ratio of Rb/W=0.33.

Then, the raw material mixture was dried in the atmosphere at 100° C. for 12 hours.

Then, 10 grams of the dried raw material mixture (precursor) was spread flat and thinly over a carbon combustion boat, heated and held and at 550° C. for 2 hours under a gas stream of 1 vol % $H_2$ gas with $N_2$ gas as a carrier (heating step).

Next, after held at 550° C. for 1 hour under a 100 vol % $N_2$ gas stream, the temperature was raised to 800° C. and held at 800° C. for 1 hour to be homogenized (homogenization step).

After the homogenization step, a blue powder was obtained.

The XRD measurement was carried out with respect to the obtained electromagnetic wave absorbing particles, and as a result of determining the lattice constants, a=7.3854 Å and c=7.5677 Å; it was confirmed that it was positioned virtually on the dashed line 11 illustrated in FIG. 1.

Also, the chemical analysis was carried out in substantially the same way as in Example 1, to determine the composition and oxygen vacancy concentration, and x as the value of Rb/W was 0.326. Also, the oxygen vacancy concentration $N_V$ was determined to be $4.57 \times 10^{21}$ $cm^{-3}$. It was confirmed that a lower oxygen vacancy concentration than in the case of $Cs_xWO_{3-y}$ was obtained even in a similar process.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Table 1.

Note that the transmittance of the electromagnetic wave absorbing sheet was 84.95% and the solar radiation was 66.55%. Also, as ST/VLT=0.783, a good near-infrared shielding effect close to Example 1 was obtained. Also, the near-infrared transmittance at the wavelength of 850 nm was 68.86%; it was confirmed that a high value was obtained.

Example 18

As the raw materials, an aqueous solution of potassium carbonate ($K_2CO_3$) and tungstic acid ($H_2WO_4$) were weighed, mixed, and kneaded to prepare a raw material mixture to be a ratio of K/W=0.25.

Then, the raw material mixture was dried in the atmosphere at 100° C. for 12 hours.

Then, 10 grams of the dried raw material mixture (precursor) was spread flat and thinly over a carbon combustion boat, heated and held and at 550° C. for 1 hour under a gas stream of 5 vol % $H_2$ gas with $N_2$ gas as a carrier (heating step).

Next, after held at 550° C. for 1 hour under a 100 vol % $N_2$ gas stream, the temperature was raised to 700° C. and held at 700° C. for 1 hour to be homogenized (homogenization step).

After the homogenization step, a blue powder was obtained.

The XRD measurement was carried out with respect to the obtained electromagnetic wave absorbing particles, and as a result of determining the lattice constants, a=7.3818 Å and c=7.5413 Å; it was confirmed that it was positioned virtually on the dashed line 12 illustrated in FIG. 1.

Also, the chemical analysis was carried out in substantially the same way as in Example 1, to determine the composition and oxygen vacancy concentration, and x as the value of Rb/W was 0.248. Also, the oxygen vacancy concentration $N_V$ was determined to be $4.13 \times 10^{21}$ $cm^{-3}$. It was confirmed that a lower oxygen vacancy concentration than in the case of $Cs_xWO_{3-y}$ was obtained even in a similar process.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Table 1.

Note that the transmittance of the electromagnetic wave absorbing sheet was 85.50% and the solar radiation was 72.35%. Also, although ST/VLT=0.846 was relatively high, a near-infrared shielding effect close to Example 16 was obtained. Also, the near-infrared transmittance at the wavelength of 850 nm was 77.75%; it was confirmed that a high value was obtained.

Example 19

As the raw materials, an aqueous solution of cesium carbonate ($Cs_2CO_3$), an aqueous solution of rubidium carbonate ($Rb_2CO_3$), and tungstic acid ($H_2WO_4$) were weighed, mixed, and kneaded to prepare a raw material mixture to be ratios of Cs/W=0.13 and Rb/W=0.20.

Then, the raw material mixture was dried in the atmosphere at 100° C. for 12 hours.

Then, 10 grams of the dried raw material mixture (precursor) was spread flat and thinly over a carbon combustion boat, heated and held and at 550° C. for 1 hour under a gas stream of 5 vol % $H_2$ gas with $N_2$ gas as a carrier (heating step).

Next, after held at 550° C. for 1 hour under a 100 vol % $N_2$ gas stream, the temperature was raised to 700° C. and held at 700° C. for 1 hour to be homogenized (homogenization step).

After the homogenization step, a blue powder was obtained.

The XRD measurement was carried out for the obtained electromagnetic wave absorbing particles, diffraction rays that indicate a single hexagonal crystal were obtained, and it was confirmed that obtained was a solid solution of Cs and Rb. The lattice constants were determined to be a=7.3960 Å and c=7.5821 Å.

Also, the chemical analysis was carried out in substantially the same way as in Example 1, to determine the composition and oxygen vacancy concentration, and x as the value of M/W was 0.325. Also, the oxygen vacancy concentration $N_V$ was determined to be $5.81 \times 10^{21}$ $cm^{-3}$.

Furthermore, an electromagnetic wave absorbing particle dispersion liquid was prepared in substantially the same way as in Example 1 except that the electromagnetic wave absorbing particles obtained in the present example were used, to evaluate the mean particle diameter. Then, in substantially the same way as in Example 1, an electromagnetic wave absorbing particle dispersion powder was produced. Then, in substantially the same way as in Example 1, an electromagnetic wave absorbing sheet was produced to evaluate spectrophotometric properties. These results are summarized in Table 1.

Note that the transmittance of the electromagnetic wave absorbing sheet was 85.41% and the solar radiation was 66.17%. Also, as ST/VLT=0.775, a good near-infrared shielding effect close to Example 1 and Example 5 was obtained. Also, the near-infrared transmittance at the wavelength of 850 nm was 65.38%; it was confirmed that a value higher than in Example 1 and in Example 5 was obtained.

Example 20

To an acrylic resin as a thermoplastic resin, a predetermined amount of the electromagnetic wave absorbing particle dispersion powder prepared in Example 1 was added so that a maximum transmittance of 89.7% in the visible light region is obtained for an electromagnetic wave absorption sheet (2.0 mm thick) to be manufactured (all maximum values were taken at around 500 nm), to prepare a composition for manufacturing electromagnetic wave absorbing sheets.

This composition for manufacturing electromagnetic wave absorbing sheets was kneaded at 260° C. by using a twin-screw extruder, extruded from a T-die, and formed into a sheet material of 2.0 mm thick by a calendar-rolling method, to obtain an electromagnetic wave absorbing sheet according to Example 20. Then, in substantially the same way as in Example 1, spectroscopic properties of the electromagnetic absorption sheet were evaluated. These results are summarized in Table 2.

Note that the transmittance of the electromagnetic wave absorbing sheet was 85.12% and the solar radiation was 65.55%. As ST/VLT=0.770, a near-infrared shielding effect equivalent to Example 1 was obtained. The near-infrared transmittance at the wavelength of 850 nm was 57.23%, which was equivalent to Example 1.

Example 21

Triethylene glycol-di-2-ethylbutyrate as a plasticizer was added to a powder of polyvinyl butyral resin as a thermoplastic resin, to produce a mixture prepared so that the ratio of the weight of the polyvinyl butyral resin to the weight of the plasticizer was [polyvinyl butyral resin/plasticizer]=100/40. To this mixture, a predetermined amount of the electromagnetic wave absorbing particle dispersion powder prepared in Example 1 was added so as to obtain a maximum transmittance of 89.7% in the visible light region for an electromagnetic wave absorbing laminated transparent base material to be manufactured (all maximum values were taken at around 500 nm), to prepare a composition for manufacturing an electromagnetic wave absorbing film. This composition for manufacturing was kneaded at 70° C. for 30 minutes using a three-roll mixer to form a mixture. The temperature of the mixture was raised to 180° C. by a molding extruder, the mixture was formed to be a film of 1 mm thick and wound around a roll, to produce an electromagnetic wave absorbing film according to Example 21.

This electromagnetic wave absorbing film according to Example 21 was cut by 10 cm×10 cm and sandwiched between two 2-mm-thick inorganic clear glass plates having the same dimensions to form a laminate. Next, the laminate was placed in a vacuum bag made of rubber, the bag was degassed and held at 90° C. for 30 minutes, cooled down to room temperature, and then, the laminate was taken out of the bag. Then, the laminate was placed in an autoclave device and pressurized at a pressure of 12 kg/cm² and heated at a temperature of 140° C. for 20 minutes to produce an electromagnetic wave absorbing laminated transparent base material according to Example 21.

Then, in substantially the same way as in Example 1, spectroscopic properties of the electromagnetic wave absorbing laminated transparent base material were evaluated. These results are summarized in Table 2.

Note that the visible transmittance of the electromagnetic wave absorbing laminated transparent base material was 83.64% and the solar transmittance was 58.98%. As ST/VLT=0.705, a near-infrared shielding effect better than Example 1 was obtained. Also, the near-infrared transmittance at the wavelength of 850 nm was 47.44%; although the value was lower than in Example 1, it was confirmed that the sensor transmittance having no problem in practice was obtained. Note that compared with Example 1, good near-infrared shielding was obtained whereas the near-infrared transmittance at the wavelength of 850 nm was decreased; this is caused by near-infrared absorption of the inorganic clear glass plates used in the production of the laminated base material.

TABLE 1

Characteristics of electromagnetic-wave-absorbing particles

| | Hold time at 550° C. (min) | Values of x and y in general formula $M_xWO_{3-y}$ | | Reliability factor (Rf) | Lattice constants | | Oxygen vacancy concentration (Nv) ($10^{21}$ cm$^{-3}$) | W—O distance Maximum/minimum | Mean particle diameter (nm) |
|---|---|---|---|---|---|---|---|---|---|
| | | x | y | — | a (Å) | c (Å) | | — | |
| Example 1 | 120 | 0.325 | 0.458 | 0.021 | 7.4068 | 7.6101 | 7.60 | 1.01 | 22.1 |
| Example 2 | 45 | 0.326 | 0.260 | 0.037 | 7.4088 | 7.6032 | 4.32 | 1.01 | 25.8 |
| Example 3 | 50 | 0.327 | 0.306 | 0.034 | 7.4083 | 7.6038 | 5.09 | 1.01 | 23.7 |
| Example 4 | 60 | 0.322 | 0.369 | 0.025 | 7.4075 | 7.6057 | 6.13 | 1.01 | 21.7 |
| Example 5 | 75 | 0.323 | 0.430 | 0.023 | 7.4078 | 7.6071 | 7.14 | 1.01 | 21.6 |
| Example 6 | 180 | 0.324 | 0.414 | 0.021 | 7.4068 | 7.6100 | 7.63 | 1.01 | 38.1 |
| Example 7 | 360 | 0.291 | 0.333 | 0.021 | 7.4064 | 7.6096 | 7.36 | 1.01 | 24.5 |
| Example 8 | 60 | 0.295 | 0.269 | 0.035 | 7.4090 | 7.5969 | 4.48 | 1.02 | 24.3 |
| Example 9 | 60 | 0.247 | 0.242 | 0.049 | 7.4155 | 7.5818 | 4.03 | 1.03 | 28.0 |
| Example 10 | 60 | 0.196 | 0.321 | 0.119 | 7.4175 | 7.5719 | 5.34 | 1.03 | 33.6 |
| Example 11 | | 0.322 | 0.456 | 0.032 | 7.4058 | 7.6102 | 7.59 | | 34.6 |
| Example 12 | | 0.324 | 0.458 | 0.028 | 7.4066 | 7.6113 | 7.62 | | 38.3 |
| Example 13 | | 0.326 | 0.401 | 0.032 | 7.4078 | 7.6086 | 7.18 | | 35.1 |
| Example 14 | | 0.324 | 0.070 | 0.026 | 7.4106 | 7.5978 | 1.41 | | 36.7 |
| Example 15 | | 0.321 | 0.185 | 0.024 | 7.4091 | 7.5998 | 2.96 | | 33.6 |
| Example 16 | | 0.323 | 0.034 | 0.027 | 7.4110 | 7.5962 | 1.17 | | 36.2 |
| Example 17 | | 0.326 | 0.201 | 0.025 | 7.3854 | 7.5677 | 4.57 | | 21.7 |
| Example 18 | | 0.248 | 0.083 | 0.041 | 7.3818 | 7.5413 | 4.13 | | 29.4 |
| Example 19 | | 0.325 | 0.367 | 0.037 | 7.3960 | 7.5821 | 5.81 | | 23.9 |
| Example 20 | | Similar to Example 1 | | | | | | | |
| Example 21 | | Similar to Example 1 | | | | | | | |

TABLE 2

Optical characteristics of electromagnetic-wave-absorbing sheet and electromagnetic-wave-absorbing transparent base material

| | Thermoplastic resin used for electro-magnetic-wave-absorbing sheet | Visible light trans-mittance (VLT) (%) | Solar trans-mittance (ST) (%) | Near infrared transmittance at wavelength 850 nm ($T_{850}$) (%) | ST/VLT |
|---|---|---|---|---|---|
| Example 1 | Polycarbonate | 84.89 | 65.08 | 57.43 | 0.767 |
| Example 2 | Polycarbonate | 86.07 | 69.15 | 67.90 | 0.803 |
| Example 3 | Polycarbonate | 85.46 | 67.17 | 64.23 | 0.786 |
| Example 4 | Polycarbonate | 85.78 | 67.18 | 63.23 | 0.783 |
| Example 5 | Polycarbonate | 85.33 | 66.66 | 60.76 | 0.781 |
| Example 6 | Polycarbonate | 85.29 | 65.30 | 57.74 | 0.766 |
| Example 7 | Polycarbonate | 84.30 | 63.73 | 54.78 | 0.756 |
| Example 8 | Polycarbonate | 84.17 | 62.08 | 53.01 | 0.738 |

TABLE 2-continued

| | Thermoplastic resin used for electro-magnetic-wave-absorbing sheet | Optical characteristics of electromagnetic-wave-absorbing sheet and electromagnetic-wave-absorbing transparent base material | | | |
|---|---|---|---|---|---|
| | | Visible light trans-mittance (VLT) (%) | Solar trans-mittance (ST) (%) | Near infrared transmittance at wavelength 850 nm ($T_{850}$) (%) | ST/VLT |
| Example 9 | Polycarbonate | 84.10 | 65.14 | 60.49 | 0.775 |
| Example 10 | Polycarbonate | 83.75 | 65.35 | 64.20 | 0.780 |
| Example 11 | Polycarbonate | 85.03 | 65.69 | 57.16 | 0.772 |
| Example 12 | Polycarbonate | 85.00 | 65.30 | 57.10 | 0.768 |
| Example 13 | Polycarbonate | 85.53 | 66.33 | 60.97 | 0.776 |
| Example 14 | Polycarbonate | 85.42 | 67.87 | 73.32 | 0.795 |
| Example 15 | Polycarbonate | 85.61 | 70.19 | 68.93 | 0.820 |
| Example 16 | Polycarbonate | 85.85 | 72.72 | 72.60 | 0.847 |
| Example 17 | Polycarbonate | 84.95 | 66.55 | 68.86 | 0.783 |
| Example 18 | Polycarbonate | 85.50 | 72.35 | 77.75 | 0.846 |
| Example 19 | Polycarbonate | 85.41 | 66.17 | 65.38 | 0.775 |
| Example 20 | Acryl | 85.12 | 65.55 | 57.23 | 0.770 |
| Example 21 | Polyvinyl butyral | 83.64 | 58.98 | 47.44 | 0.705 |

As above, electromagnetic wave absorbing particle dispersoids and electromagnetic wave absorbing laminated transparent base materials have been described with reference to the embodiments, examples, and the like. Note that the present invention is not limited to the embodiments, examples, and the like described above. Various modifications and changes can be made within the scope of the gist of the present invention described in the claims.

The present application is based on and claims priority to Japanese Patent Application No. 2017-154812 filed with the Japan Patent Office on Aug. 9, 2017, and the entire contents of Japanese Patent Application No. 2017-154812 are incorporated herein by reference.

The invention claimed is:

1. An electromagnetic wave absorbing particle dispersoid comprising:
   at least electromagnetic wave absorbing particles and a thermoplastic resin,
   wherein the electromagnetic wave absorbing particles contain hexagonal tungsten bronze having oxygen deficiency,
   wherein the tungsten bronze is expressed by a general formula: $M_xWO_{3-y}$ (where one or more elements M include at least one or more species selected from among K, Rb, and Cs, 0.15≤x≤0.33, and 0<y≤0.46), and
   wherein oxygen vacancy concentration $N_V$ in the electromagnetic wave absorbing particles is greater than or equal to $4.3×10^{14}$ cm$^{-3}$ and less than or equal to $8.0×10^{21}$ cm$^{-3}$.

2. The electromagnetic wave absorbing particle dispersoid as claimed in claim 1, wherein the one or more elements M further include one or more species selected from among Na, Tl, In, Li, Be, Mg, Ca, Sr, Ba, Al, and Ga as an additive element.

3. The electromagnetic wave absorbing particle dispersoid as claimed in claim 1, wherein one or more elements M is constituted with Cs, and
   wherein $a_{M-HTB}$(Å) and $C_{M-HTB}$(Å) as the lattice constants a and c of the hexagonal tungsten bronze, in a coordinate space wherein a horizontal axis represents a lattice constant a(Å), a vertical axis represents a lattice constant c(Å), to represent a coordinate position by (the lattice constant a, the lattice constant c), have following relationships of formulas (3) and (4) with a point ($a_{Cs}$, $c_{Cs}$) positioned on a straight line of $c_{Cs}=-3.436a_{Cs}+33.062$:

$$a_{M-HTB}=a_{Cs}±0.0084 \quad (3)$$

$$c_{M-HTB}=c_{Cs}±0.0184 \quad (4)$$

4. The electromagnetic wave absorbing particle dispersoid as claimed in claim 3, wherein said $c_{Cs}$ satisfies 7.576≤$c_{Cs}$≤7.610.

5. The electromagnetic wave absorbing particle dispersoid as claimed in claim 1, wherein one or more elements M is constituted with Rb, and
   wherein $a_{M-HTB}$(Å) and $c_{M-HTB}$(Å) as the lattice constants a and c of the hexagonal tungsten bronze, in a coordinate space wherein a horizontal axis represents a lattice constant a(Å), a vertical axis represents a lattice constant c(Å), to represent a coordinate position by (the lattice constant a, the lattice constant c), have following relationships of formulas (5) and (6) with a point ($a_{Rb}$, $c_{Rb}$) positioned on a straight line of $c_{Rb}=-3.344a_{Rb}+32.265$:

$$a_{M-HTB}=a_{Rb}±0.0084 \quad (5)$$

$$c_{M-HTB}=c_{Rb}±0.0184 \quad (6)$$

6. The electromagnetic wave absorbing particle dispersoid as claimed in claim 5, wherein said $c_{Rb}$ satisfies 7.517≤$c_{Rb}$≤7.580.

7. The electromagnetic wave absorbing particle dispersoid as claimed in claim 1, wherein one or more elements M is constituted with K, and
   wherein $a_{M-HTB}$(Å) and $c_{M-HTB}$(Å) as the lattice constants a and c of the hexagonal tungsten bronze, in a coordinate space wherein a horizontal axis represents a lattice constant a(Å), a vertical axis represents a lattice constant c(Å), to represent a coordinate position by (the lattice constant a, the lattice constant c), have following relationships of formulas (7) and (8) with a point ($a_K$, $c_K$) positioned on a straight line of $c_K=-2.9391a_K+29.227$:

$$a_{M-HTB}=a_K±0.0084 \quad (7)$$

$$c_{M-HTB}=c_K±0.0184 \quad (8)$$

8. The electromagnetic wave absorbing particle dispersoid as claimed in claim 7, wherein said $c_K$ satisfies 7.504≤$c_K$≤7.564.

9. The electromagnetic wave absorbing particle dispersoid as claimed in claim 1, wherein in an WO6 octahedron present in a crystal of the hexagonal tungsten bronze, a ratio of a maximum value to a minimum value among distances each representing a distance from an O atom present in the c-axis direction when viewed from a W atom at a center to the W atom is greater than or equal to 1.00 and less than or equal to 1.10.

10. The electromagnetic wave absorbing particle dispersoid as claimed in claim 1, wherein a mean particle diameter of the electromagnetic wave absorbing particles is greater than or equal to 0.1 nm and less than or equal to 100 nm.

11. The electromagnetic wave absorbing particle dispersoid as claimed in claim 1, wherein the thermoplastic resin is one of one species of resin selected from among a group of resins including polyethylene terephthalate resin, polycarbonate resin, acrylic resin, styrene resin, polyamide resin, polyethylene resin, vinyl chloride resin, olefin resin, epoxy resin, polyimide resin, fluororesin, ethylene-vinyl acetate copolymer, and polyvinyl acetal resin; a mixture of two or more resins selected from among the group of resins; and a copolymer of two or more resins selected from among the group of resins.

12. The electromagnetic wave absorbing particle dispersoid as claimed in claim 1, wherein the electromagnetic wave absorbing particles are contained by greater than or equal to 0.5 mass % and less than or equal to 80.0 mass %.

13. The electromagnetic wave absorbing particle dispersoid as claimed in claim 1, wherein the electromagnetic wave absorbing particle dispersoid has a sheet shape, a board shape, or a film shape.

14. An electromagnetic wave absorbing laminated transparent base material, comprising:
 a plurality of sheets of transparent base materials; and
 the electromagnetic wave absorbing particle dispersoid as claimed in claim 1,
 wherein the electromagnetic wave absorbing particle dispersoid is arranged between the plurality of sheets of the transparent base materials.

15. The electromagnetic wave absorbing particle dispersoid as claimed in claim 3, wherein a mean particle diameter of the electromagnetic wave absorbing particles is greater than or equal to 21.6 nm and less than or equal to 38.1 nm.

16. The electromagnetic wave absorbing particle dispersoid as claimed in claim 5, wherein a mean particle diameter of the electromagnetic wave absorbing particles is greater than or equal to 21.6 nm and less than or equal to 38.1 nm.

17. The electromagnetic wave absorbing particle dispersoid as claimed in claim 7, wherein a mean particle diameter of the electromagnetic wave absorbing particles is greater than or equal to 21.6 nm and less than or equal to 38.1 nm.

* * * * *